(12) United States Patent
Smith et al.

(10) Patent No.: US 10,937,705 B2
(45) Date of Patent: Mar. 2, 2021

(54) SAMPLE INSPECTION USING TOPOGRAPHY

(71) Applicant: ONTO INNOVATION INC., Wilmington, MA (US)

(72) Inventors: Nigel P. Smith, Beaverton, OR (US); Holly M. Edmundson, Hillsboro, OR (US); Michael A. Gilmore, Bend, OR (US)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 16/197,849

(22) Filed: Nov. 21, 2018

(65) Prior Publication Data
US 2019/0304851 A1    Oct. 3, 2019

Related U.S. Application Data

(60) Provisional application No. 62/651,042, filed on Mar. 30, 2018.

(51) Int. Cl.
*G01N 21/88* (2006.01)
*G01N 21/95* (2006.01)
(Continued)

(52) U.S. Cl.
CPC ......... *H01L 22/12* (2013.01); *G01N 21/8806* (2013.01); *G01N 21/8851* (2013.01);
(Continued)

(58) Field of Classification Search
CPC .............. H01L 22/12; H01L 21/67288; G01N 21/8806; G01N 21/8851; G01N 21/9501; G01N 21/956
(Continued)

(56) References Cited

U.S. PATENT DOCUMENTS

| 5,864,394 A | 1/1999 | Jordan, III et al. |
| 5,875,029 A | 2/1999 | Jann et al. |

(Continued)

FOREIGN PATENT DOCUMENTS

WO    2004072629 A1    8/2004

OTHER PUBLICATIONS

International Search Report and Written Opinion dated Feb. 27, 2019 from PCT/US2018/062821, filed Nov. 28, 2018.
(Continued)

*Primary Examiner* — Ly D Pham
(74) *Attorney, Agent, or Firm* — Paradice and Li LLP

(57) ABSTRACT

Defects are detected using surface topography data. The defects may be detected by determining topography characteristics within a region of interest on a sample, and the same topography characteristics of at least one reference surface. By comparing the topography characteristics in the region of interest for the sample and reference surface, common pattern structures may be removed, leaving only variations, which may be used to identify the presence of defects. For example, thresholds may be used to identify variations in the topography characteristics as defect candidates. Defects may be identified based on, e.g., size, height, shape, texture, etc. of candidate defects. In some implementations, rather than using a reference surface, the topography characteristic of the surface within the region of interest may be inspected based on prior knowledge of a required surface topography for the region of interest to determine if a defect is present.

41 Claims, 11 Drawing Sheets

(51) Int. Cl.
  *H01L 21/66* (2006.01)
  *H01L 21/67* (2006.01)
  *G01B 11/30* (2006.01)
  *G01B 9/02* (2006.01)
  *G01N 21/956* (2006.01)

(52) U.S. Cl.
  CPC ....... *G01N 21/9501* (2013.01); *G01N 21/956* (2013.01); *H01L 21/67288* (2013.01); *G01B 11/303* (2013.01); *G01N 2021/8848* (2013.01); *H01L 22/20* (2013.01)

(58) Field of Classification Search
  USPC .................. 700/110; 356/150, 460, 477, 479
  See application file for complete search history.

(56) References Cited

U.S. PATENT DOCUMENTS

| | | | |
|---|---|---|---|
| 6,295,382 B1 | 9/2001 | Karanovic | |
| 6,747,697 B1 | 6/2004 | Lin et al. | |
| 7,230,717 B2 | 6/2007 | Brock et al. | |
| 7,463,765 B2 | 12/2008 | Messina et al. | |
| 7,532,318 B2 | 5/2009 | Meeks et al. | |
| 7,684,032 B1 | 3/2010 | Meeks | |
| 7,864,334 B2 | 1/2011 | Jeong | |
| 8,275,573 B1* | 9/2012 | Schmit | G01B 11/2441 702/167 |
| 9,013,688 B2 | 4/2015 | Gutman | |
| 9,235,885 B2 | 1/2016 | Amzaleg et al. | |
| 9,786,044 B2 | 10/2017 | Fuchs et al. | |
| 2005/0046865 A1* | 3/2005 | Brock | G01B 9/02057 356/495 |
| 2006/0067571 A1 | 3/2006 | Onishi | |
| 2007/0071307 A1* | 3/2007 | Isomura | G06T 7/001 382/149 |
| 2007/0115483 A1* | 5/2007 | Oak | G01B 11/303 356/600 |
| 2007/0153273 A1* | 7/2007 | Meeks | G01B 11/0616 356/369 |
| 2007/0252986 A1 | 11/2007 | Sandstrom | |
| 2009/0037134 A1 | 2/2009 | Kulkarni et al. | |
| 2011/0181868 A1* | 7/2011 | Stokowski | B82Y 10/00 356/51 |
| 2012/0216169 A1* | 8/2012 | Park | H01L 22/12 716/136 |
| 2013/0044316 A1* | 2/2013 | Gastaldo | G01N 21/47 356/237.2 |
| 2013/0066454 A1* | 3/2013 | Geshel | G06F 30/00 700/97 |
| 2013/0336574 A1* | 12/2013 | Nasser-Ghodsi | G06T 7/001 382/145 |
| 2015/0226539 A1* | 8/2015 | Roeth | G01B 11/005 356/614 |
| 2016/0153914 A1* | 6/2016 | Lange | G01N 21/8806 356/237.5 |
| 2016/0163752 A1 | 6/2016 | Sambongi et al. | |
| 2016/0292840 A1 | 10/2016 | Konecky | |
| 2016/0358041 A1* | 12/2016 | Venkataraman | G06K 9/6269 |
| 2016/0373664 A1 | 12/2016 | Wei | |
| 2017/0011495 A1* | 1/2017 | Gaind | G01N 21/9501 |
| 2017/0016715 A1 | 1/2017 | Heidrich et al. | |
| 2017/0132772 A1* | 5/2017 | Ogawa | G02B 27/283 |
| 2017/0178314 A1* | 6/2017 | Nukada | G03F 7/7065 |
| 2017/0315070 A1* | 11/2017 | Kikuiri | H01J 37/244 |
| 2017/0352141 A1* | 12/2017 | Nakashima | G06T 5/20 |
| 2019/0139208 A1* | 5/2019 | Chen | G06T 7/30 |
| 2019/0170655 A1* | 6/2019 | Smith | G01B 9/02081 |

OTHER PUBLICATIONS

International Search Report and Written Opinion dated Mar. 11, 2019 from PCT/US2018/062825, filed Nov. 28, 2018.
Larkin, Kieran G., "Efficient nonlinear algorithm for envelope detection in white light interferometry," J. Opt. Soc. Am. A/ vol. 13, No. 4, Apr. 1996, pp. 832-843.
Brock, Neal J. et al, "A pixelated polarizer-based camera for instantaneous interferometric measurements," SPIE vol. 8160-32.
Kimbrough, Brad et al., "Dynamic surface roughness profiler," SPIE vol. 8126, 81260H-1.
U.S. Appl. No. 16/197,737, filed Nov. 21, 2018.
Tobin, Kenneth W., "Inspection in Semiconductor Manufacturing," Webster's Encyclopedia of Electrical and Electronic Engineering, vol. 10, pp. 242-262, Wiley & Sons, NY, NY, 1999.
U.S. Appl. No. 16/197,929, filed Nov. 21, 2018.

* cited by examiner

SAMPLE INSPECTION USING TOPOGRAPHY

CROSS REFERENCE TO RELATED APPLICATIONS

This application claims priority under 35 USC 119 to U.S. Provisional Application No. 62/651,042, entitled "FAST WAFER INSPECTION USING TOPOGRAPHY," filed Mar. 30, 2018, which is incorporated herein by reference in its entirety.

FIELD OF THE INVENTION

The present invention is related to optical inspection of samples, such as semiconductor wafers, using surface topography to detect defects.

BACKGROUND

Semiconductor and other similar industries, often use optical tools for non-contact evaluation of samples during processing. One type of evaluation is defect inspection. Defects, such as particles or other irregularities on a sample, may interfere with the performance of the finished devices. Conventionally, optical tools used to detect defects use bright-field and dark-field inspection. Bright-field and dark-field detection tools detect defects based on the scattering of light caused by defects. Defect detection requires acquiring data from large portions of a sample, and often from the entire sample. As the size of semiconductor devices continues to shrink and designs become more complex, it is necessary to detect smaller defects, which is increasingly difficult with conventional optical inspection tools, such as bright-field and dark-field detection tools.

SUMMARY

One or more defect types that cause yield loss are detected using surface topography data acquired by, e.g., an interferometer. The defects may be detected by determining topography characteristics of a surface within a region of interest on a sample, and the same topography characteristics of at least one reference surface that is, by design, identically patterned. By comparing the topography characteristics in the region of interest for the sample and reference surface, common pattern structures may be removed, leaving only variations, which may be used to identify the presence of defects. For example, thresholds may be used to identify variations in the topography characteristics as defect candidates. Defects may be identified based on, e.g., size, height, shape, texture, etc. of candidate defects. In some implementations, rather than using a reference surface, the topography characteristic of the surface within the region of interest may be inspected based on prior knowledge of a required surface topography for the region of interest to determine if a defect is present.

In one implementation, a method of detecting a defect on a sample includes obtaining optical data from the sample, the optical data comprising a plurality of pixels; determining a test topography characteristic for each pixel in a test region of interest of the sample from the optical data; determining a reference topography characteristic for each corresponding pixel in a region of interest of at least one reference surface, the region of interest of the at least one reference surface having an identical by design pattern as the test region of interest on the surface of the sample; comparing the test topography characteristic for each pixel to the reference topography characteristic for each corresponding pixel of the at least one reference surface to determine a presence of a defect in the test region of interest on the sample; and communicating defect data including the presence of the defect in the test region of interest on the sample to adjust one or more process tools associated with a fabrication process step in the fabrication sequence or to alter a future fabrication sequence of the sample.

In one implementation, an optical inspection apparatus configured to detect a defect in a test region of interest on a sample includes a light source that produces an illumination beam; an objective lens that directs the illumination beam to be incident on a sample and to receive light reflected by the sample; at least one detector array that receives the light after it is reflected by the sample to obtain optical data from the sample, the optical data comprising a plurality of pixels; at least one processor coupled to the detector array to receive the optical data, wherein the at least one processor is configured to: determine a test topography characteristic for each pixel in a test region of interest of the sample from the metrology data; determine a reference topography characteristic for each corresponding pixel in a region of interest of at least one reference surface, the region of interest of the at least one reference surface having an identical by design pattern as the test region of interest on the surface of the sample; compare the test topography characteristic for each pixel to the reference topography characteristic for each corresponding pixel of the at least one reference surface to determine a presence of a defect in the test region of interest on the sample; and communicate defect data including the presence of the defect in the test region of interest on the sample to adjust one or more process tools associated with a fabrication process step in the fabrication sequence or to alter a future fabrication sequence of the sample.

In one implementation, a method of detecting a defect on a sample includes obtaining optical data from the sample, the optical data comprising a plurality of pixels; determining a topography characteristic for each pixel in a region of interest of the sample from the optical data; determining a presence of a defect in the region of interest using the topography characteristic for each pixel in a region of interest and prior knowledge of a required topography characteristic for the region of interest; and communicating defect data including the presence of the defect in the test region of interest on the sample to adjust one or more process or metrology tools associated with a fabrication process step in the fabrication sequence or to alter a future fabrication sequence of the sample.

In one implementation, optical inspection apparatus configured to detect a defect includes a light source that produces an illumination beam; an objective lens that directs the illumination beam to be incident on a sample and to receive light reflected by the sample; at least one detector array that receives the light after it is reflected by the sample to obtain optical data from the sample, the optical data comprising a plurality of pixels; at least one processor coupled to the detector array to receive the optical data, wherein the at least one processor is configured to: determine a topography characteristic for each pixel in a region of interest of the sample from the optical data; determine a presence of a defect in the region of interest using the topography characteristic for each pixel in a region of interest and prior knowledge of a required topography characteristic for the region of interest; and communicate defect data including the presence of the defect in the test region of interest on the sample to adjust one or more process or metrology tools associated with a fabrication process step in the fabrication sequence or to alter a future fabrication sequence of the sample.

DESCRIPTION

Interferometers are optical tools, conventionally used for optical metrology, to measure height differences on the surface of sample, i.e., surface topography. Interferometers are capable of measuring height differences on an object by determining the phase of the interference signal at each pixel. Determining the phase of the signal requires obtaining multiple measurements from each point on the sample. Scanning interferometers, for example, physically move (scan) the sample or a reference surface along the optical axis, functionally perpendicular to the surface of the sample, to modify the signal phase. Scanning interferometers typically scan in steps that produce a quarter-wave change in phase. By processing the multiple measurements at different phases from each point on the sample, the vertical height (Z) of the surface at each point on the sample may be determined. Scanning interferometry, however, is slow due to the scanning process.

Figure 1:
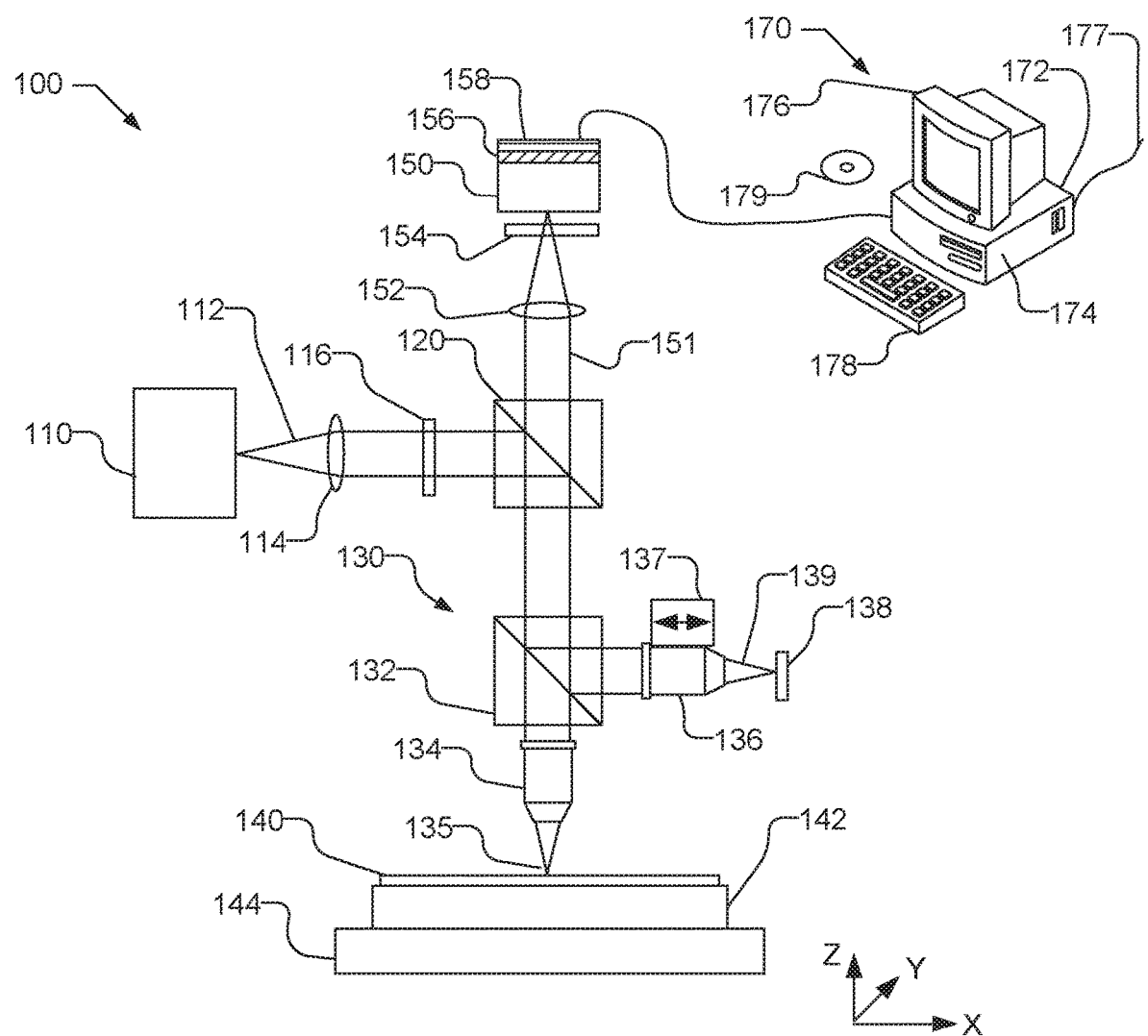
FIG. 1 illustrates a schematic view of a phase shift interferometer.

FIG. 1 illustrates a schematic view of an interferometer 100 that is capable of surface height (Z), e.g., topography, measurements of at least a portion of the sample, e.g., in a region of interest, from a single camera image. The sample, for example, may be a semiconductor wafer, flat panel substrate or other type of sample. The sample surface topography may be used for an evaluation of the surface of the sample, such as defect inspection, as described herein, and accordingly, interferometer 100 is suitable for the evaluation of the surface of the sample, such as defect inspection.

Interferometer 100 is a phase shifting interferometer that uses a phase mask with an array of pixels that produce multiple phase shifts so that the interferometry data with multiple phase shifts may be acquired with a single exposure. Consequently, unlike a scanning interferometer, the time per acquisition of interferometer 100 is limited only by the time to move, focus and perform pattern recognition, and the image transfer rate, and is not a function of scan time. Moreover, because interferometer 100 obtains the data with a single exposure, the effects of vibration in all axes are reduced, especially those at low frequencies.

As discussed herein, the interferometer 100 may detect a sample surface topography to find various types of defects. Defects types that may be detected using topography information from the interferometer 100 include, but are not limited to, e.g., 1) residue, in which an unwanted thin film remains on a portion of the sample surface; 2) dishing, in which an area of the sample is polished to a greater depth than intended; 3) edge roll-off, in which the height of a specific area within the product die changes near the edge of the sample (normally the effect is for a monotonic height increase or decrease as the distance from wafer center increases); and 4) localized topography deviations driven by the product design, sometimes referred to as "hotspots," where, for example, changes in pattern density may interact with other process steps such as Chemical-Mechanical-Polishing (CMP) and lead to device failure, generally in later process steps.

As illustrated, interferometer 100 includes a light source 110 to produce polarized light, an interferometric objective 130 to produce orthogonally polarized test and reference beams and a camera 150 that includes a phase mask 156 in the form of a pixel-level phase shift array. The light source 110 in the interferometer 100 may be a narrow band light source that produces a desired wavelength of light, e.g., approximately 450 nm. The light source 110, for example, may be an LED, laser or incandescent source, such as a tungsten lamp, or a plasma source or arc lamp, or any other suitable high brightness light source. One or more appropriate filters may be used in conjunction with a light source with too great a bandwidth, though this design would be less efficient. By way of example, a light source, such as an LED, with 20 nm full width at half maximum (FWHM) bandwidth may be used. If desired, a Kohler illumination, critical illumination, or other intermediate form of illumination or other distribution, such as annular, may be used. By way of example, in Kohler illumination, light 112 from the illumination aperture (not shown) is imaged by an illumination lens 114 on the back focal plane of the two objectives in the interferometric objective 130, illustrated as being arranged in a Linnik configuration, after passing through one or more beamsplitters 120, 132.

Light from the light source 110 passes through a polarizer 116, which may be, e.g., a linear polarizer, but in some embodiments may be a circular polarizer, and have variable orientation that is adjustable to maximize fringe contrast. The beam splitter 120, which may be a non-polarizing 50/50 beam splitter, directs, e.g., reflects, the polarized light to an interferometric objective 130. The use of polarized light is required if the phase mask 156 relies on polarization to produce the phase shift, as is the case with a wire polarizer grid, but in other embodiments of the phase mask 156, e.g. where different materials or material thicknesses are used to introduce the phase shift in one of the signal or reference paths, unpolarized light may be used.

The interferometric objective 130 is configured to split incident light into a test beam 135 that is reflected from the sample 140 and a reference beam 139 that is reflected from a reference surface 138 and to recombine the reflected test beam from the sample with the reflected reference beam from the reference surface. The interferometric objective 130 is illustrated, by way of example, as a Linnik geometry, but if desired, other interferometric objectives may be used, such as a Michelson or Mirau objective. The choice of objective may be restricted depending on the polarization state of light in the instrument.

The interferometric objective 130 is illustrated as including a beam splitter 132, a sample objective 134 for imaging the surface of the test sample, and a complementary reference objective 136 and the reference mirror 138. The beam splitter 132 is used to separate the incident light between the two objectives 134 and 136. The beam splitter 132 may be a polarizing beam splitter so that the polarization states are orthogonal between the sample and reference paths 135 and 139. For example, the beamsplitter 132 may transmit light that is linearly polarized in the plane of the angled face of the beamsplitter 132 and reflect light with the orthogonal polarization. Any form of polarizing beamsplitter may be used, examples with good efficiency include those with wire grid polarizing elements, or a MacNeille cube with an appropriate thin film coating at the internal angled face of the beamsplitter cube. The properties of the beamsplitter 132 may be matched to the bandwidth of the light source 110, as a change in polarization efficiency with wavelength will change the balance of, or mix the polarization states of, light in the reflected and transmitted beams.

In the configuration of FIG. 1, light incident at the sample 140 and at the reference mirror 138, is linearly polarized. The linear polarizer 116 in the path of the beam 112 may be used to change the proportion of light parallel to each polarization axis of the beamsplitter 132, and thus the relative strength of the beam in each path 135 and 139. Adjusting the linear polarizer 116 in this way allows the intensity of the test and reference beams to be brought to the same level, and hence generate the highest possible interference fringe contrast, which is desirable. This is an advantage as it allows the interferometer to be optimized for samples with varying reflectivity.

FIG. 1 illustrates an actuator 137 as attached to the reference objective 136 to move the reference objective 136 along the optical axis to vary the optical path difference between the test beam 135 incident on the sample 140 and the reference beam 139 incident on the reference mirror 138. Actuator 137 may be used, e.g., to focus the interferometer 100 at a measurement location, and is not used for scanning the reference surface to acquire multiple phase shifts at a particular location. In practice, the reference objective 136 alone, the reference mirror 138 alone, the sample, or the entire optical assembly of the interferometric objective 130 may be moved along the optical axis to alter the optical path difference between the test beam 135 and the reference beam 139. It should be understood, however, that with other interferometric objectives, the path difference may be varied in other ways. From an optical perspective, there is no difference between the sample or the entire imaging system moving relative to each other; however, there are practical implications, i.e., the mass of the optical system may limit the selection of the stage which may in turn limit the minimum stage accuracy.

As illustrated, the test beam 135 from the sample objective 134 is incident on the sample 140, which is held on a chuck 142 mounted on a stage 144. The stage 144 is capable of horizontal motion in either Cartesian (i.e., X and Y) coordinates, or Polar (i.e., R and θ) coordinates or some combination of the two, in order to properly position each desired location on the sample relative to the interferometric objective 130 for measurement. The stage may also be capable of vertical motion along the z coordinate, e.g., for focusing, instead of the actuator 137.

The test beam 135 is reflected from the sample 140 and the resulting reflected beam passes back through the sample objective 134 and is combined by the beam splitter 132 with the reflected reference beam 139 which similarly passes back through the reference objective 136. Interference between the sample and reference beams occurs.

The resulting combined beam 151 is directed, e.g., transmitted, by the beam splitter 120 towards the camera 150. It should be understood that if desired, the beam splitter 120 may transmit the illuminating light from the light source 110 and reflect the light reflected from the sample 140. It should also be understood that the beam splitter 132 need not be a polarizing beam splitter if a phase mask that relies on a method other than polarization is used to produce a shift in signal phase. For example, rather than using polarized light, unpolarized light may be used if a phase delay is produced in one of the beam paths, e.g., the reference beam 139 path, by placing the phase mask, with pixelated phase delay elements, at the reference surface 138.

Figure 2:
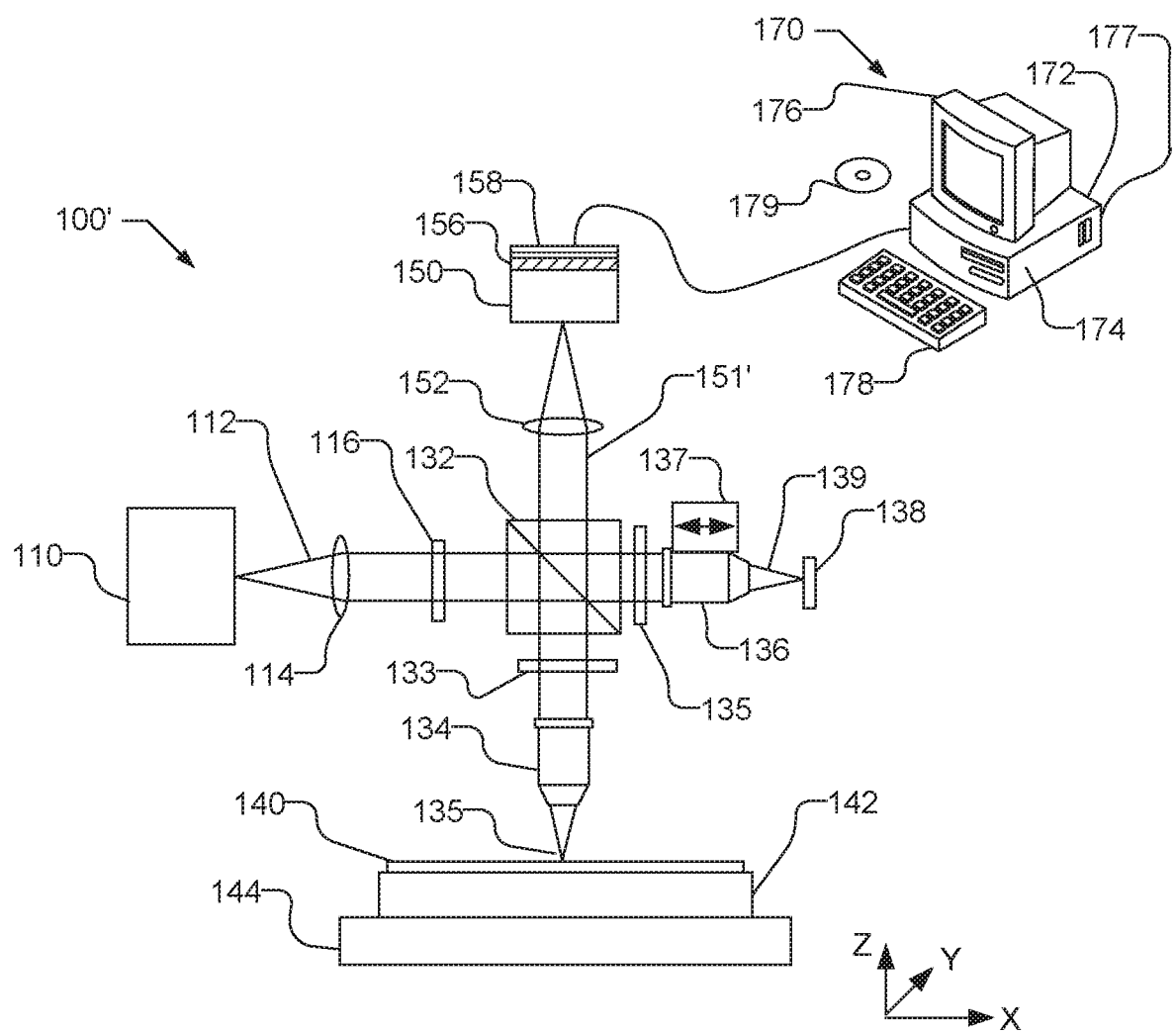
FIG. 2 illustrates a schematic view of another configuration of phase shift interferometer.

FIG. 2 illustrates another configuration of an interferometer 100' that avoids the need for beam splitter 120 shown in FIG. 1 by using circularly polarized light. Interferometer 100' is similar to interferometer 100, shown in FIG. 1, like designated elements being the same. In the configuration of interferometer 100', shown in FIG. 2, circular polarizers 131 and 133 are positioned before sample objective 134 and reference objective 136 so that the light incident at the sample and reference surfaces is circularly polarized. The configuration of interferometer 100' in FIG. 2 allows the function of the non-polarizing beamsplitter 120, shown in FIG. 1, to be replaced by the fourth face of the polarizing beamsplitter 132. The configuration shown in FIG. 2 uses circularly polarized light in each of the sample and reference paths as each path must make one reflection and one transmission in the polarizing beamsplitter 132, which advantageously balances the effect of any imbalance in the polarization efficiency of the polarizing beamsplitter 132. Additionally, operating with circularly polarized light at the sample surface is an advantage when the sample is a semiconductor wafer, as the patterns on the wafers include many sets of lines that behave as linear polarizers and give rise to an orientation sensitivity of the instrument.

As illustrated in both FIG. 1 and FIG. 2, the reflected beams are imaged by a lens 152 onto the camera 150. An output polarizer 154 may be positioned between the lens 152 and the camera 150, as the combined beams 151, 151' consist of linearly polarized light. The polarization orientations of the light reflected from the sample 140 and from the reference mirror 138 in the combined beams 151, 151' are orthogonal. A circular polarizer 154, for example, a quarter wave plate, converts the orthogonally polarized beams into opposite direction circularly polarized light, e.g., the p-polarized test beam from the sample 140 is converted into right-hand circular polarization and the s-polarized reference beam from the reference mirror 138 is converted into left hand circular polarization.

The camera 150 includes a phase mask 156 with an array of pixels that produce multiple phase shifts before a detector array 158, such as a CCD array that is aligned pixel-to-pixel with the array of pixels in the phase mask 156, and which are located in substantially the same image planes. The combined beams 151, 151' pass through the pixel array of the phase mask 156 creating a number (N) of interleaved samples of the interference pattern on the detector array 158, with, e.g., the same magnitude of phase difference between each sample. Thus, the camera 150 receives an image of the sample combined with the reference signal, which, due to a small path difference, creates an interferogram. The different phase shift elements in the phase mask 156 produce an interleaved image of a number (N) samples, each with the same phase shift, i.e. there are N different samples of the interferogram as function of phase. Groups of nearby samples (pixels) with different phase shifts may be processed together to obtain the local height. The phase mask 156, by way of example, may be a pixel array of linear polarizers arranged in groups of four, e.g., with polarizer orientation 0°, 45°, 90° and 135°, that introduce phase shifts between the signal and reference beams that is twice the referenced polarizer orientation. The phase mask 156 and detector array 158 may be, e.g., a Phasecam manufactured by 4D Technologies using a wire grid polarizer array manufactured by Moxtek.

Figure 3A:
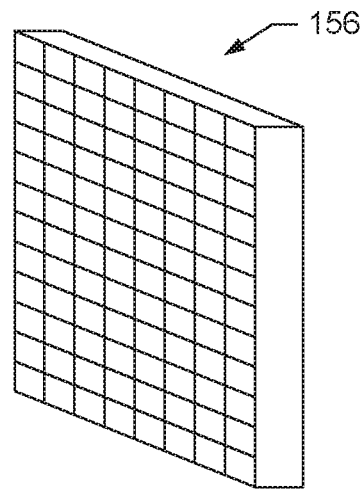
FIGS. 3A and 3B illustrate a side perspective view and a top plan view of a phase mask.
Figure 3B:
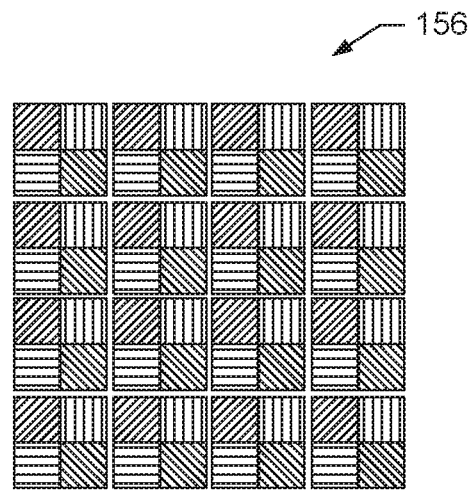
Figure 3C:
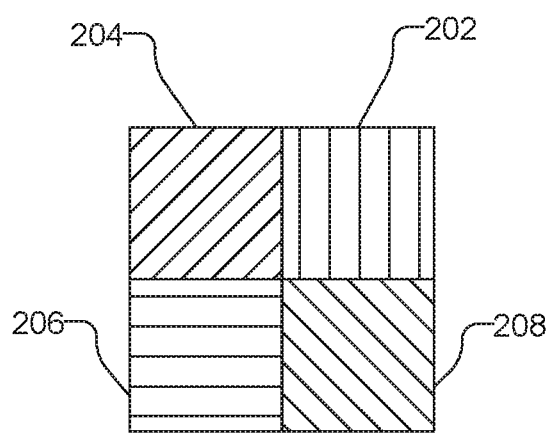
FIG. 3C illustrates a unit portion of the phase mask that includes a 2×2 array of polarizer pixels with four discrete polarizations, which are repeated over the entire phase mask.

FIGS. 3A and 3B illustrate a side perspective view and a top plan view of the phase mask 156. FIG. 3C illustrates a unit portion of the phase mask 156 that includes a 2×2 array of polarizer pixels, 202, 204, 206, and 208 with four discrete polarizer orientations (0°, 45°, 90°, 135°), with the unit portion repeated over the entire phase mask 156, so that the phase mask 156 includes a repeated array of pixels having discrete polarizer orientations. The polarizer pixels 202, 204, 206, and 208 orientations at 0°, 45°, 90°, and 135° enable interference with phase shifts of 0°, 90°, 180°, and 270°, respectively, between the test beam 135 and reference beam 139. The pixels in the array of the phase mask 156 have a size and spacing that match the size and spacing of the pixels in the detector array 158, so that each pixel in the detector array 158 is matched, i.e., aligned, with a corresponding pixel of the phase mask 156.

Figure 3D:
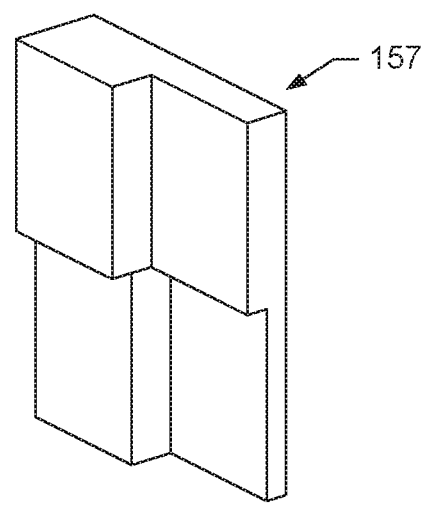
FIG. 3D illustrates a unit portion of the phase mask that includes a 2×2 array of phase delay elements with different phase delays, which are repeated over the entire phase mask.

Alternatively, in place of the pixels having discrete polarizer orientations in the phase mask 156, a phase mask may use an array of phase delay pixels. FIG. 3D, for example, illustrates a side perspective view of a unit portion 157 of phase delay pixels that may be used in a phase mask and repeated over the entire phase mask. Such a phase mask, for example, may be a birefringent quartz mask etched to different depths in an array of pixels, e.g., one unit portion is illustrated in FIG. 3D, that match the pixel size and spacing of pixels in the detector array 158 and is aligned the detector array 158. With the use of phase delay pixels in the phase mask 156, polarized light may not be used in interferometers 100, 100', and the phase mask with phase delay pixels may be placed in, e.g., the reference beam 139 path at the reference surface 138, to produce the phase delay between the sample beam 135 and the reference beam 139. Each phase delay pixel introduces one of a number of potentially different delays between the reference and sample beams. Manufacturing techniques for such a mask are known in the semiconductor industry, where phase change is commonly used in photomasks for lithography. Depth control in each phase element may be improved by calibrating the phase delay at each pixel.

Other arrangements of the camera 150 are possible. For example, if desired, phase shift steps other than 90° may be used. Moreover, it may be advantageous to use more than four phase shifts in a unit. Further, the arrangement of the pixels need not be in the order shown in FIG. 3C or 3D. Other types of arrangements of pixels that may be used are described further in the U.S. patent application Ser. No. 16/197,929, entitled "Interferometer with Pixelated Phase Shift Mask," filed Nov. 21, 2018, which is incorporated by reference in its entirety.

The interferometer 100 may use polarization data to determine a phase difference between the test beam 135 and the reference beam 139, which are orthogonally polarized by the polarizing beam splitter 132. The output polarizer 154, e.g., the quarter wave plate, converts the linearly polarized test beam 135 and reference beam 139 to left and right hand circular polarizations, which interfere after passing through the phase mask 156. The detector array 158 receives the resulting light after interference and the intensity at each pixel in the detector array 158 is converted to an electrical charge.

The camera 150, e.g., the detector array 158, is coupled to a computer 170, such as a workstation, a personal computer, central processing unit or other adequate computer system, or multiple systems. The computer 170 is preferably included in, or is connected to or otherwise associated with interferometer 100. The computer 170 may also control the movement of the stage 144, as well as control the operation of the chuck 142. The computer 170 also collects and analyzes the interferometric data obtained from the camera 150 as discussed herein. For example, the computer 170 may analyze the interferometric data to determine one or more physical characteristics of the sample 140, such as the presence of a defect, as discussed below. The computer 170, which includes at least one processor 172 with memory 174, as well as a user interface including e.g., a display 176 and input devices 178. A non-transitory computer-usable storage medium 179 having computer-readable program code embodied may be used by the computer 170 for causing the at least one processor to control the interferometer 100 and to perform the functions including the analysis described herein. The data structures and software code for automatically implementing one or more acts described in this detailed description can be implemented by one of ordinary skill in the art in light of the present disclosure and stored, e.g., on a computer-usable storage medium 179, which may be any device or medium that can store code and/or data for use by a computer system such as processor 172. The computer-usable storage medium 179 may be, but is not limited to, magnetic and optical storage devices such as disk drives, magnetic tape, compact discs, and DVDs (digital versatile discs or digital video discs). A communication port 177 may also be used to receive instructions that are used to program the computer 170 to perform any one or more of the functions described herein and may represent any type of communication connection, such as to the internet or any other computer network. The communication port 177 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Thus, the determined one or more physical characteristics of the sample 140, such as the presence of a defect, as discussed below, including the size, position, type, etc., may be determined by the computer system 170 and may be communicated and stored, e.g., in memory or in a database. The defect data may be communicated to adjust one or more process tools associated with particular fabrication process steps in the fabrication sequence (e.g., process tools responsible for the detected defects) or to adjust the fabrication sequence of the sample itself, e.g. by rejecting or discarding the sample or a portion of the sample.

For example, semiconductor process lines may use the defect data by associating an expected yield loss or kill rate with each of the defect types detected. The kill rates of defects typically combine using survival statistics to determine which die are likely to yield. In order to estimate yield impact from the reported defects on a given wafer, classifications may be assigned. In one implementation, the classification may be performed in an automated fashion using the features calculated for each defect. In another implementation, the wafer may be loaded onto another tool with a higher spatial resolution, and images are captured of each defect so that the defects may be classified, e.g., manually by operators. The defect data, which may include location and classification, may be used in a variety of ways. For example, the defect data may be used to adjust the fabrication sequence of the sample itself, e.g., by rejecting or discarding the sample or a portion of the sample, e.g., the entire wafer or a die from the wafer, based on the number, types, and locations of detected defects. For example, if a wafer exceeds a threshold for yield loss, the entire wafer may be scrapped, avoiding the consumption of downstream process tool resources.

Moreover, defect data may be used to adjust one or more process tools associated with particular fabrication process steps in the fabrication sequence (e.g., process tools responsible for the detected defects), including adjusting process parameters or removing process tools from the production line. For example, the defect data may be compared to defect data from wafers undergoing slightly different upstream processing, from which adjustments may be made to the process parameters of specific process tools to reduce defects. In one example, the slurry composition of a Chemical Mechanical Polishing (CMP) tool may be altered based on defect data. By comparing defect populations before and after a slurry change, the slurry composition that produces fewer defects can be identified and used. In this manner, the inline yield learning provided by the defect inspection tool provides rapid tuning of a process flow, e.g., during process development. Additionally, the defect data may be used to monitor the health of upstream process tools and to identify and take corrective action with respect to any tools responsible for defects. For example, with an understanding of the most likely root causes of each defect type at a given processing step, the health of upstream process tools may be monitored using the defect data. By way of example, this type of excursion monitoring may be performed using a statistical process control (SPC) system to flag a sample as out of specification due to one or more defect types. Based on the type of defects, the upstream process tools responsible for the excursions may be identified and appropriately addressed, e.g., by adjusting process parameters or by taking the process tools down for maintenance before further samples are affected. The defect data may also be used to optimize process tool preventative maintenance schedules.

If desired, other types of interferometers may be used to obtain the surface topography of a sample. For example, an interferometer may separate the combined sample and reference beams to be detected by multiple detectors, each with a single linear polarizing element, rather than using a phase mask. An alternative arrangement allowing simultaneous detection of the interference signal with multiple phase shifts is possible by separating the combined test and reference beams to multiple cameras, each with a different linear polarizer angle. Such an arrangement allows the maximum pixel density to be achieved, with pixels in the different paths sampling the same point on the sample, but with extra cost and the difficulty of maintaining alignment between the separated channels and avoiding mixing the polarization states as the beam is separated. If the system is configured so that light incident on the sample and reference mirror is linearly polarized, then a circular polarizer may be used in this arrangement, which may be single circular polarizer placed before the combined beam is separated, or each path after separation of the combined beam may have its own circular polarizer.

Figure 4:
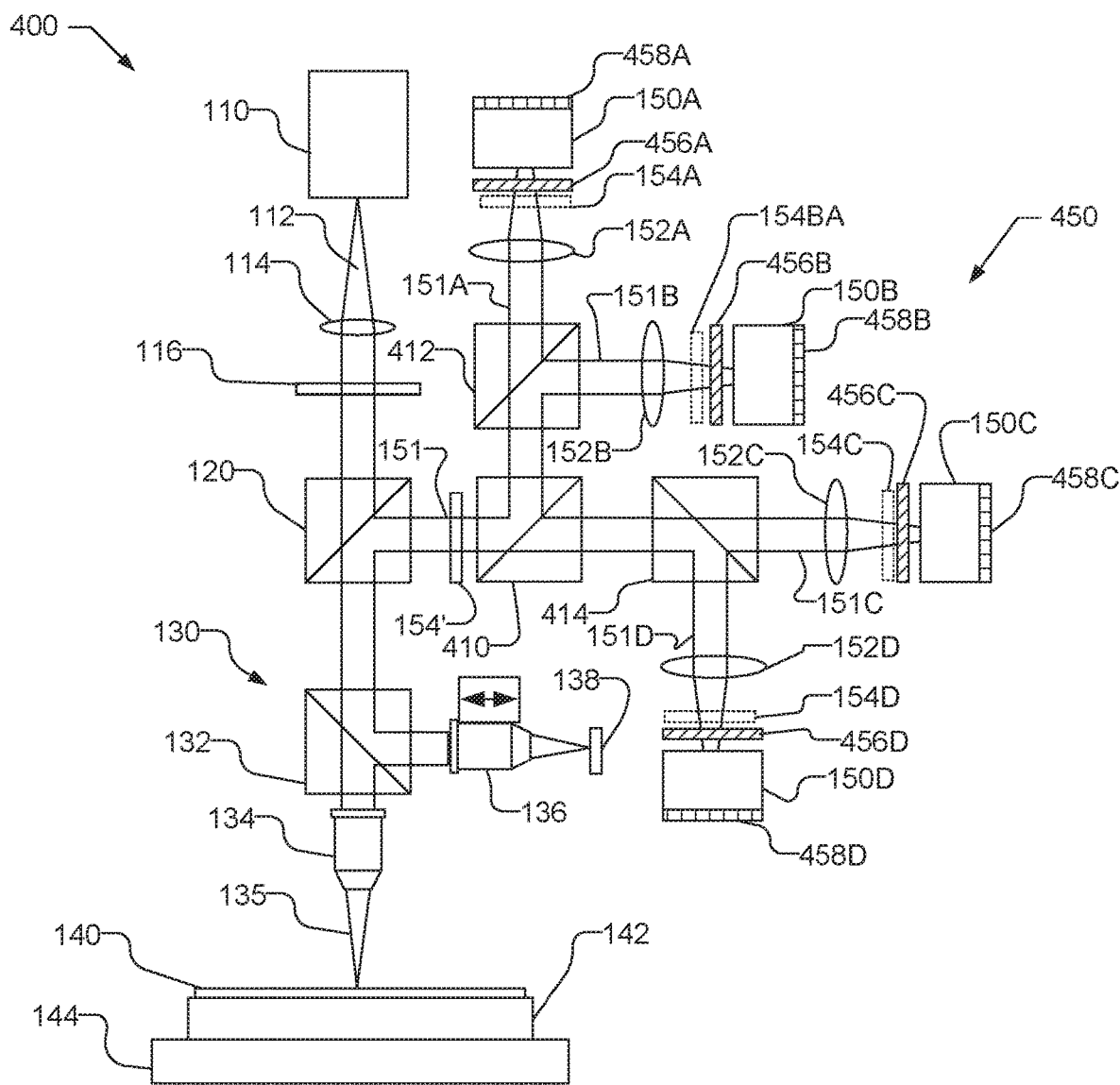
FIG. 4 illustrates a schematic view of another configuration of phase shift interferometer.

FIG. 4, by way of example, illustrates a schematic view of an interferometer 400, similar to interferometer 100 shown in FIG. 1, like designated elements being the same, but that separates the combined beam 151 into multiple beams that are directed to multiple cameras. Unlike interferometer 100, interferometer 400 does not use a pixel-level phase mask array positioned before a single detector array, but instead uses a plurality of polarizers before a corresponding plurality of detector arrays.

As illustrated in FIG. 4, the resulting combined beam 151 is directed, e.g., reflected, by the beam splitter 120 towards an array 450 of separate detectors. A first beam splitter 410 splits the beam 151 into two separate beams, each of which is further split by beam splitters 412 and 414 forming four beams. Each of the resulting four beams 151A, 151B, 151C, and 151D is directed to a separate detector. For example, beam 151A is imaged by a lens 152A onto the camera 150A. If desired, a single output polarizer 154', e.g., a quarter wave plate, may be positioned before the beam splitter 410, or alternatively, as illustrated with dotted boxes, separate output polarizers 154A, 154B, 154C, and 154D may be located before each separate detector, e.g., between the lens and the camera. The output polarizer 154' (or output polarizers 154A, 154B, 154C, and 154D) may be, e.g., a quarter wave plate at 45 degrees, to convert the p-polarized test beam from the sample 140 into right-hand circular polarization and the s-polarized reference beam from the reference mirror 138 into left hand circular polarization. As discussed above, if the incident polarization is circular, there is no need for a quarter wave plate. With the quarter wave plate 154' (or 154A, 154B, 154C, and 154D) present, a polarizer 456A may be positioned between the output polarizer and the camera 150A. If desired, polarizer 456A may be positioned elsewhere, e.g., prior to the output polarizer 154A or within the camera 150A. The beam 151A forms an interference pattern on the detector array 458A of the camera 150A. Beam 151B likewise passes through lens 152B, output polarizer 154B, and polarizer 456B, and is received by the detector array 458B of camera 150B. Similarly, beam 151C passes through lens 152C, output polarizer 154C, and polarizer 456C, and is received by the detector array 458C of camera 150C. Beam 151D passes through lens 152D, output polarizer 154D, and polarizer 456D, and is received by the detector array 458D of camera 150D. The pixels of detector arrays 458A, 458B, 458C, and 458D (sometimes referred to collectively as detector arrays 458) are aligned so that they image the same area on the sample 140, where corresponding pixels in the separate detector array 458 correspond to the same location on the sample 140. Each of the detector arrays 458 is coupled to the computer 170, e.g., as illustrated in FIG. 1, for analyzing the interferometric data to determine one or more physical characteristics of the sample 140, such as the presence of a sub-resolution defect.

If desired, the polarizers 456 may be wire grid polarizers or, alternatively, birefringent phase delay elements, which may have different thicknesses of quartz or other suitable material.

Polarizers 456A, 456B, 456C, and 456D have four discrete polarizations, e.g., 0°, 45°, 90°, 135°, thereby enabling interference with phase delays of 0°, 90°, 180°, and 270°, respectively, between the test beam 135 and reference beam 139. Thus, the use of four separate polarizers 456A, 456B, 456C, and 456D (sometimes referred to collectively as polarizers 456) and associated detector arrays 458A, 458B, 458C, and 458D replaces the phase mask 156 with its 2×2 array of polarizer (phase delay) pixels in the interferometer 100. Accordingly, interferometer 400 has four times the resolution of interferometer 100.

With the use of phase mask, as illustrated in FIGS. 1 and 2, or alternatively illustrated in FIG. 4, the surface height z at a single location represented by a unit of pixels may be determined as the signal is detected at four different phases simultaneously. If all four pixels are at the same height, z, the signals $S_i$ (where i is the phase shift at each pixel expressed as a multiple of 90°, and it should be understood that a phase shift of 360° is the same as a phase shift of 0°) received in the 2×2 unit of pixels may be used to calculate the surface height z, e.g., using $$z = \frac{\lambda}{4\pi}\tan^{-1}\left(\frac{S_1 - S_3}{S_2 - S_4}\right) \qquad \text{eq. 1}$$

Thus, the height z, can be determined using equation 1 from the four phase signals if $\lambda$ is known. Other means of calculating these parameters from four measured intensities, or from a different number of intensities, are possible as will be apparent to those of ordinary skill in the art.

By way of example, the surface height z may be determined using three known phase shifts. For example, with three samples ($S_i$, i=1,2,4), the surface height z may be determined from:

$$\tan(kz) = 2\left(\frac{S_4 - S_1}{S_4 - S_2}\right) - 1. \qquad \text{eq. 2}$$

It should be understood that different samples $S_i$ may be selected, and that other means of calculating these parameters from three measured intensities are possible as will be apparent to those of ordinary skill in the art.

Advantageously, because phase shift interferometers, such as interferometers 100, 100', and 400 are capable determining a topography of a sample surface from a single captured image, these devices are capable of quickly inspecting the entire surface of a sample, e.g., a semiconductor wafer, for defects, e.g., at rates comparable to or faster than conventional inspection tools, such as bright field and dark field inspection tools. Further, with all data obtained within a single exposure, the effects of vibration in all axes are reduced, especially those at low frequencies. The sensitivity of the phase shift interferometers is adequate to detect surface height variation caused by defects and the lateral resolution may be configured, e.g., with desired image size (e.g., pixel size and array size), and objective magnification, to capture desired defects of interest, e.g., having a lateral size from 0.2 µm to at least 100 µm. For example, in one embodiment, the pixel size may be matched to the resolution of the interferometer. With a wavelength of 450 nm and instrument numerical aperture (NA) of 0.30, the instrument resolution using the Sparrow limit ($\lambda$/2NA) is 750 nm. Using a pixel size of 750 nm sets the effective tool resolution to 1.5 µm (because measurement uses a 2×2 pixel kernel) while providing the largest possible acquisition area from each camera image, and hence the best sample acquisition rate. The detection of even smaller defects may be performed and used herein and is described further in the U.S. patent application Ser. No. 16/197,737, entitled "Sub-Resolution Defect Detection," filed Nov. 21, 2018, which is incorporated by reference in its entirety.

If desired, other types of tools capable of measuring the topography, e.g., surface height (Z), of a sample may be used to detect defects as discussed herein. For example, known tools such as Atomic Force Microscopes (AFM), Transmission Electron Microscopes (TEM), and scanning interferometers may be used to measure the surface height (Z) of a sample and may be used, if desired, to detect defects of a sample, as discussed herein. Instruments such as AFM, TEM and scanning interferometers acquire data relatively slowly compared to interferometers 100, 100', and 400, discussed above, and thus may have decreased throughput. Nevertheless, such instruments are capable of topography measurements and may be used to detect defects as discussed herein.

Figure 5:
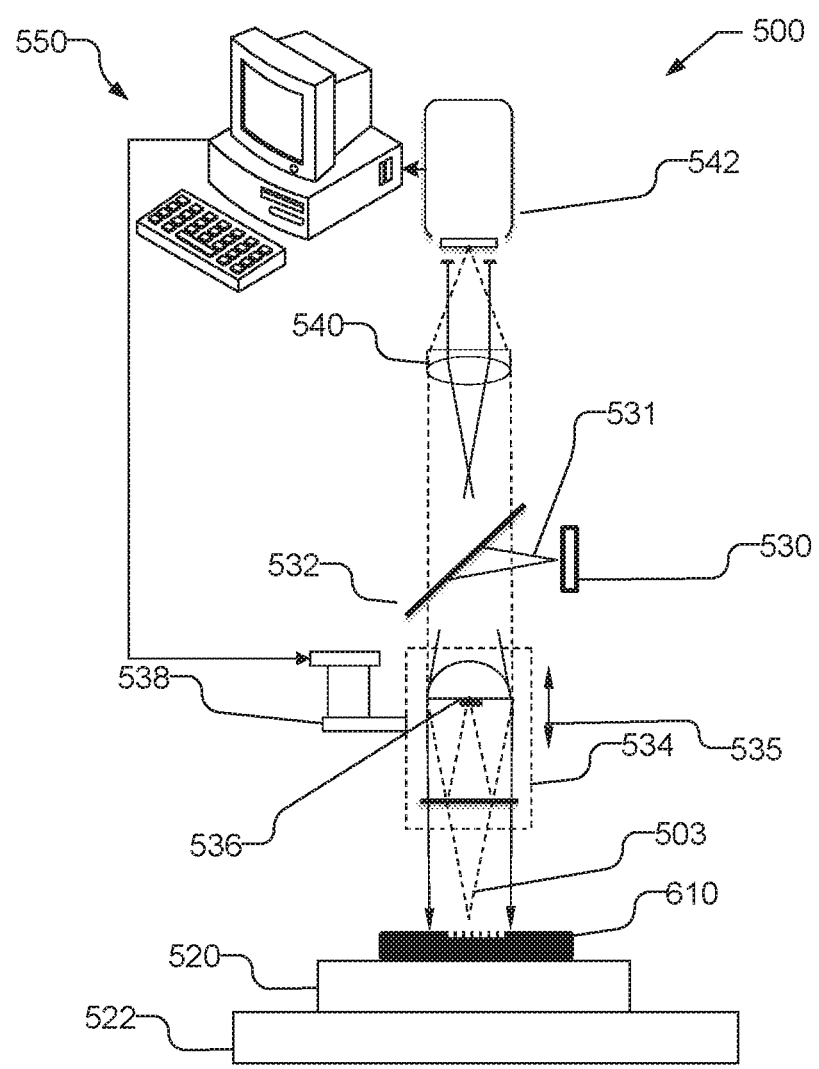
FIG. 5 illustrates a schematic view of a scanning interferometer.

FIG. 5, by way of example, illustrates a scanning interferometer 500 that may be used to detect defects as discussed herein. As illustrated, the interferometer 500 includes a light source 530 that provides a broadband or narrow band light beam 531. The light source 530, for example, may produce wavelengths of light in UV, blue, visible, or IR ranges. A beam splitter 532 directs light beam 531, e.g., reflects light beam 531, towards an interference objective 534 that includes a reference mirror 536. The interference objective 534 is coupled to an actuator 538, which is controlled by the computer system 550, to adjust the vertical position (Z height) of the interference objective 534 along the optical axis, so that interference signals at multiple phase shifts may be acquired. The interference objective produces a probe beam 503 that is incident on and reflects from the sample 510, passes back through the interference objective 534 and beam splitter 532 and is focused by imaging lens 540 onto detector 542, which is coupled to the computer system 550. The resulting interference patterns, sometimes referred to interference signals, may be used to determine a surface height (sometimes referred to as z-height) at the measurement position (sometimes referred to as a pixel) on the sample 510. The surface topography of the surface of the sample 510 may be determined by moving the sample 510 via stage 522 or the interferometer 500 to different measurement positions (pixels) and measuring the surface height at each position. By scanning and measuring the z-height for a plurality of pixels, the surface topography of the sample 510 can be measured.

It should be understood that the surface height measured at each position on the sample 510 is a relative surface height, e.g., determined by the z-height of the interference objective 534. The height of any point on the wafer surface may also be determined with respect to a fixed reference for the entire wafer, such as a point on the back surface of the wafer, or a reference point at a known location on the front of the wafer, by summing relative height measurements between the test and reference points, and including the wafer thickness if necessary. Making a height measurement relative to a fixed reference point in this way requires connecting relative height data between multiple fields of view, and the accumulated errors in this process may make the resulting data of low quality. The use of a single fixed reference point is not necessary for defect detection as described herein.

As with the interferometers illustrated in FIGS. 1, 2, and 4, interferometer 500 may measure the surface height at each position of the sample 510 and use the measured surface height to characterize one or more parameters of the sample 510, including detection of defects, warp, bow, large scale or micro-scale 3D surface topology, or other such characteristics, as discussed herein.

A device, such as interferometers 100 and 100' shown in FIGS. 1 and 2, and interferometer 400 shown in FIG. 4, capable of measuring topography characteristics of a sample may be used to detect defects on a sample by comparing topography characteristics of the sample with those of a reference that is by design identically patterned. If desired, other devices capable of measuring topography characteristics of a sample surface, such as scanning interferometer 500 shown in FIG. 5, an AFM, a TEM, or other similar devices, may be used to detect defects using a similar process. A topography measuring device may compare topography characteristics from the test sample and reference sample to identify variations in the topography characteristics. The topography characteristic, for example, may be the height of the surface or a characteristic such as roughness.

A comparison of the topography characteristics, for example, subtracting the topography characteristics of the region of interest of the sample from the topography characteristics of the reference location on a pixel-by-pixel basis, removes common pattern structures or characteristics and leaves only variations. Resulting variations may be determined to be defects, e.g., using thresholding to identify candidate defects and filtering candidate defects based on one or more defect characteristics, such as height, size, shape, texture, etc.

The choice of referencing strategy is relevant for detecting particular defects of interest. In conventional defect detection methodology, die-to-die comparisons are typically made using sets of neighboring die in a double-detection mode, e.g., one target and two references, where the two references are chosen to be as close as possible to the target. This approach inherently ignores variation with a length scale longer than, e.g., a die, and is referred to herein as spatially "local". Defect detection using a local reference is suitable, e.g., for detecting random defect modes such as particle, pit, scratch, bridge, residue, etc. Conventional defect detection using a local reference, however, cannot capture other yield loss mechanisms that, e.g., occur at a long length scale, greater than the length scale of a die, which is referred to herein as "non-local". These types of yield loss mechanisms can be induced by any process that lacks uniformity over the sample, but most notably by material deposition processes, Chemical Mechanical Polishing (CMP), and lithography processes. These 'non-local' effects are present in 300 mm wafers and will become more critical for 450 mm wafers. Another type of yield loss mechanism that is not captured by conventional defect detection using a local reference is systematic defect modes that repeat in every die or shot. These types of defects do not produce a signal, e.g., when comparing die within the same wafer, but will have a signal when compared to other wafers with slightly different processing. The references created for inter-sample comparison are referred to, herein as "golden" references.

In one implementation of defect detection, different types of reference surfaces, e.g., local, non-local, and golden, may be used in the defect detection process, e.g., to detect different types of defects. Moreover, multiple types of reference surfaces may be used together for a better description of possible wafer yield loss mechanisms.

Local referencing, for example, may be implemented by selecting areas on the same sample as the test area based on criteria such as spatial proximity, typical rastering pattern, and distance from the wafer edge. The spatial proximity allows areas that are closest to the test area to be selected. For example, if the sample is a semiconductor wafer with a plurality of dies, areas within one die distance from a test area may be selected as spatially proximate. Additionally, as the typical rastering pattern follows a row of die/shot in wafer x direction, reference die/shot to either side of the test die may be given priority. Moreover, following the rastering pattern helps in throughput since the image processing may start earlier and leave fewer images in memory waiting for reference images. Finally, a reference area or die may not be selected if it is within configurable distance from the wafer edge. This avoids selecting references that are less likely to represent "normal" topography characteristics.

Figure 6:
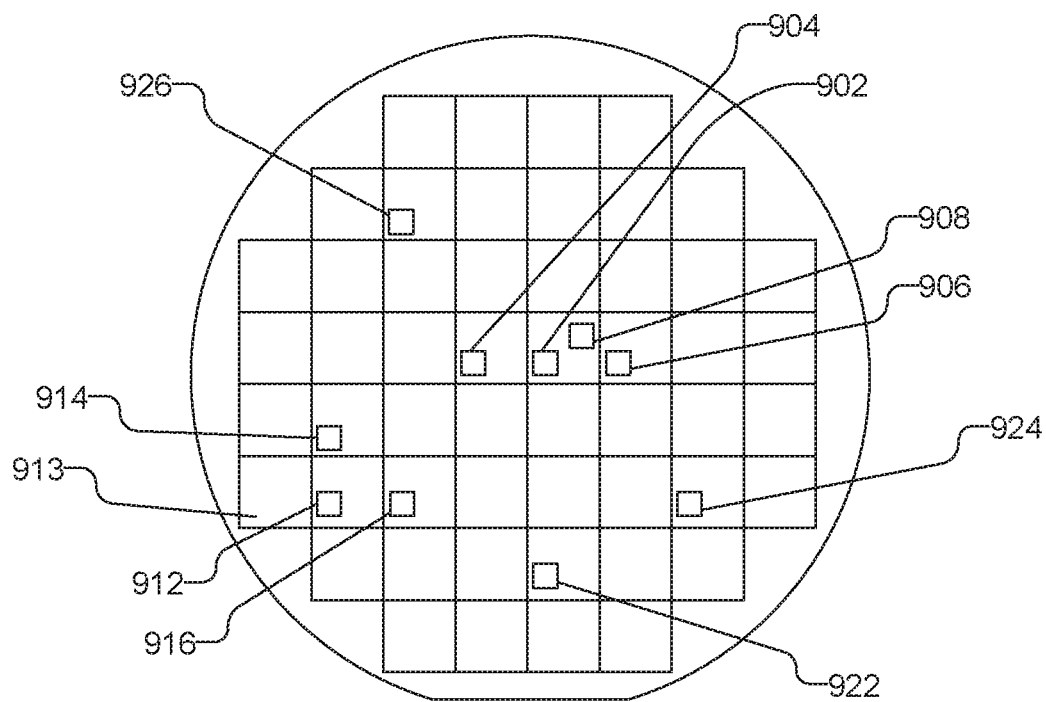
FIG. 6 illustrates a wafer showing a test areas and local and nonlocal reference areas.

FIG. 6, by way of example, illustrates a sample in the form of a wafer 600, with a test area 602 (e.g., region of interest (ROI)), and two local reference areas 604, 606, which are selected based on spatial proximity and rastering pattern, and thus, are on either side of the test area 602 within a die length. FIG. 6 illustrates the test area 602 smaller than a die, but if desired, the test area, i.e., the region of interest, may be the same size as a die, or larger than a die depending on the parameters of the instrument obtaining the data. The reference areas have the same designed pattern as the test area 602, and thus, if desired, a local reference 608 that is within the same die as test area 602 and that has same designed pattern may be selected for the test area 602. Also, illustrated is a second test area 612 and two local reference areas 614 and 616, which are selected based on one or more factors, such as spatial proximity, rastering pattern, and distance to the wafer edge. It is noted that area 613 is not selected as a local reference for test area 612 as area 613 is close to the wafer edge.

Nonlocal referencing may be used to detect slowly varying process conditions across the wafer. Defects in this case are better detected using reference data that is from locations other than from adjacent die or shots, and using a reference that is based on, e.g., calculated as the average of, several samples measured across different shots. Since non-uniform effects tend to be a function of distance from the wafer center, it may be advantageous, but not essential, for the average reference data to be biased towards reference data obtained at the center of the wafer, or at some other location where process conditions are known to be closer to ideal than elsewhere.

Nonlocal referencing, for example, may be implemented by selecting areas on the same sample as the test sample that is farther than a local reference. FIG. 6, for example, illustrates several nonlocal reference areas 624, 626, 628 that may be selected for test area 602 and/or test area 612. In some implementations, a nonlocal reference may accumulate as a global reference for each unique within-die/shot field of view. The accumulation of reference may be performed so as to minimize the data that needs to be stored in memory while still minimizing the contributions of outliers. For example, if a median calculation were to be used, many images for each field of view would need to be stored in memory. The accumulation of references may use exponential smoothing, which advantageously requires only one image per field of view. In addition, the accumulation of nonlocal reference surfaces may be adapted so that contributions can be weighted by the within-wafer coordinate. This may be particularly useful, e.g., for weighting the global reference contributions for reference surfaces close to the samples center. A weighting function for accumulation of nonlocal reference surfaces may be written:

$$s_t = \alpha \cdot x_t + (1-\alpha) \cdot s_{t-1} \qquad \text{eq. 3}$$

Figure 7:
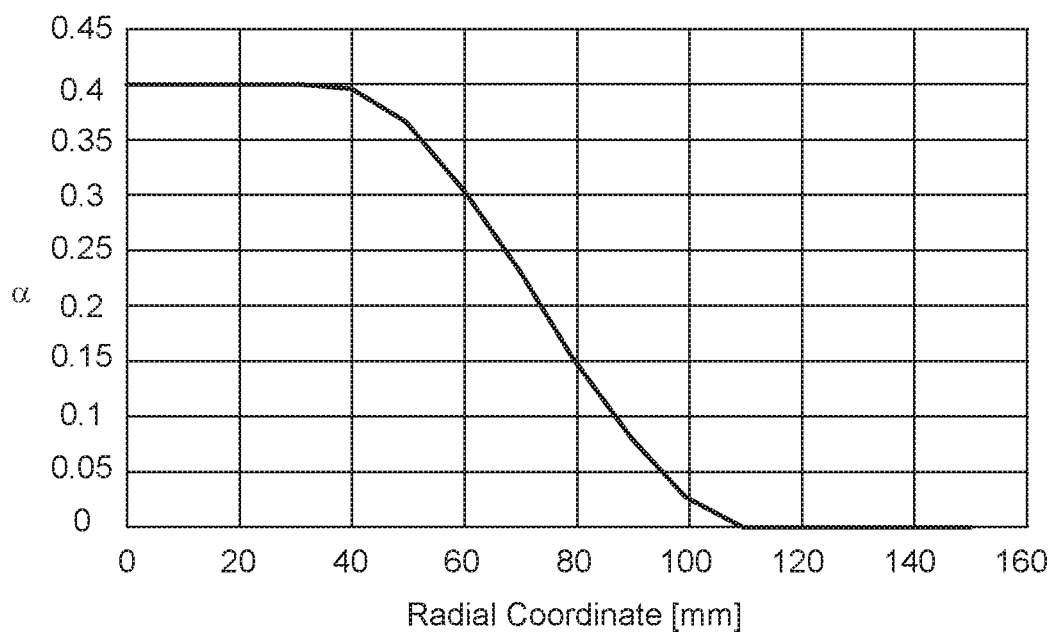
FIG. 7 is a graph illustrating a weighting function that may be used with accumulating reference surfaces.

In equation 3, $x_t$ may be the pixel value from the latest site contributing to the global nonlocal reference, $s_{t-1}$ and $s_t$ are the global reference value before and after the new contribution, respectively, and $\alpha$ is weighted by the sample radial coordinate, e.g., with a piece-wise function. FIG. 7, for example, illustrates an example of the weighting function. As can be seen, the sample center has the largest $\alpha$ value, which means those contributions to the global nonlocal reference will be large, while at the wafer edge $\alpha$ has a value of zero, which means those field of view will not contribute to the global reference. A cosign function provides a smooth transition between the two extremes.

Golden referencing, for example, may be implemented by selecting areas on different samples, e.g., different wafers. Golden referencing may similarly use the accumulation of reference surfaces, as used in the nonlocal referencing to minimize the storage requirements. By way of example, the inspection of a first sample may trigger the construction of a new golden reference. Subsequently inspected samples may be compared to the golden reference and accumulated with the golden reference, as discussed above.

Defects may be systematic because of interactions between device design and process steps. For example, that the effectiveness of chemical-mechanical polishing (CMP), which is commonly used to reduce surface height variation to within the focal depth of the lithography tool, varies with the material, density and shapes of the patterns on the wafer surface. Some structures are polished more or less rapidly than others and so become more prone to pattern dimensional errors at the next lithography step, or to bridging or unwanted gap errors.

In the absence of any process variations across a wafer, all locations with the same pattern should remain identical, but may still depart from the intended layout and give rise to defects. These types of defects are referred to as systematic defects, and may not be readily detected by comparing the topography of a test sample surface with that of from adjacent die or shots on the wafer. Detection of systematic defects, however, is still possible, e.g., either by comparing test areas to other areas with the same pattern but in different locations within the device, or by using prior knowledge of required surface topography. The former is useful if the process step causing the defect has a non-uniform spatial signature. An example of the use of prior knowledge is application to overlay targets, in which it is known that those parts of an overlay target patterned at the same process step must be coplanar, otherwise an asymmetry is introduced that causes a shift in the overlay measurement.

Figure 8A:
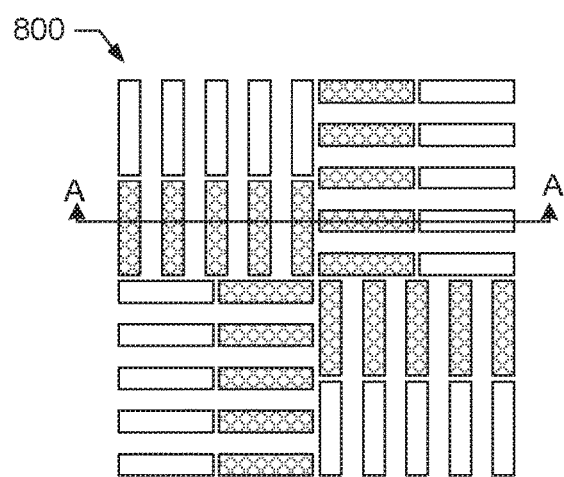
FIGS. 8A and 8B illustrate a top plan view and a cross-sectional view of an overlay target with asymmetrical surface topography.
Figure 8B:
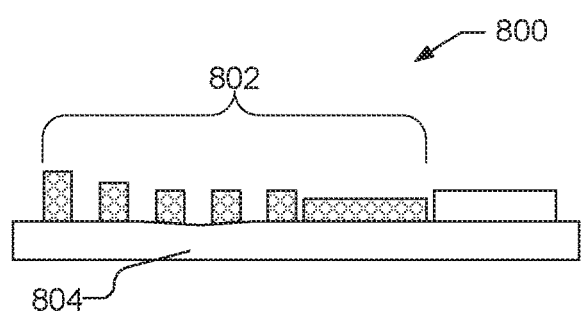

In addition, defect detection may be possible using prior knowledge of required surface topography. For example, prior knowledge of required surface topography may be applied to detect defects in overlay targets that may affect the overlay measurement. FIGS. 8A and 8B, by way of example, respectively illustrate a top plan view of an overlay target 800 and a cross-sectional view of the overlay target 800 along line AA in FIG. 8A. Overlay measurements made using an overlay target assume that the overlay target is symmetric, e.g., the shaded bars are coplanar, and similarly the non-shaded bars are coplanar. If either the shaded bars are not coplanar or the non-shaded bars are not coplanar, the symmetry of the overlay target 800 is broken and an overlay measurement of the overlay target 800 will be in error. For example, as illustrated in FIG. 8B, the shaded bars 802 in the overlay target 800 are not coplanar. Moreover, in FIG. 8B, the surface 804 underlying the shaded bars 804 is not planar. The asymmetry in the surface topography of the overlay target 800, e.g., the lack of coplanarity in the shaded bars 802 (and the lack of planarity of the underlying surface 804) shown in FIG. 8B, is a systematic defect that will cause an error in an overlay measurement based on the overlay target 800. Such a defect may be detected using the optical device disclosed herein based on prior knowledge of required surface topography. If such a defect is detected, the overlay target 800 may not be used for an overlay measurement or the defect may be considered in the overlay measurement, e.g., by using the targets topography to correct the model of the overlay target 800.

Figure 9:
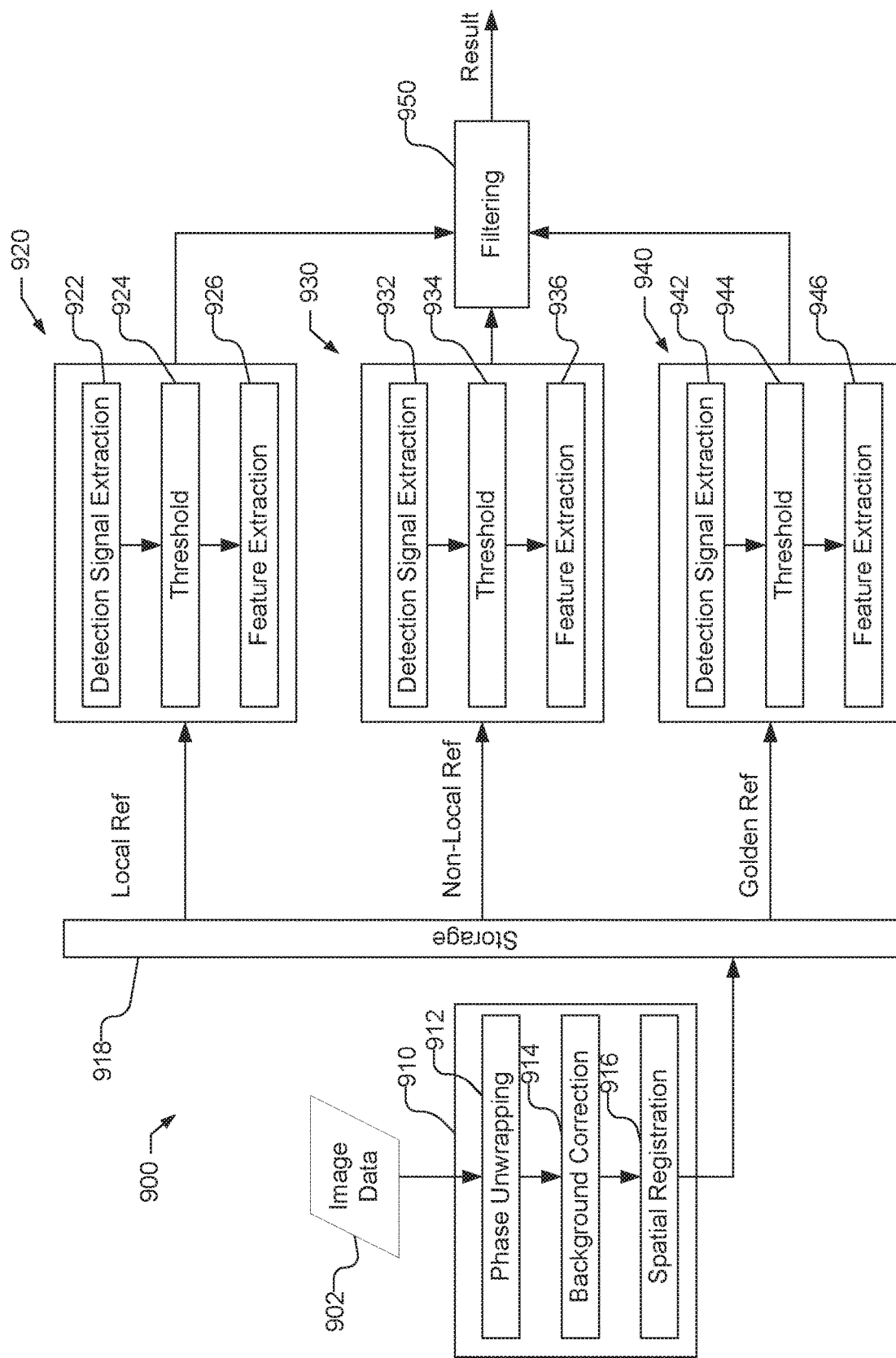
FIG. 9 is a flow chart illustrating a defect detection process using topography characteristics of a sample and one or more reference surfaces.
Figure 10A:
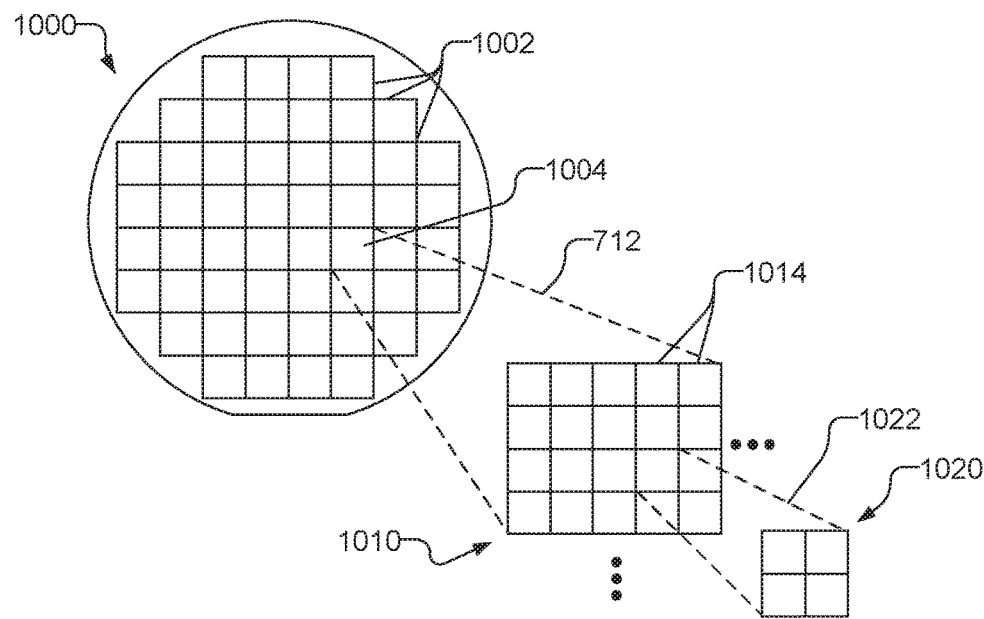
FIG. 10A illustrates image data acquired by a phase shift interferometer, such as that shown in FIGS. 1 and 2.

FIG. 9 is a flow chart illustrating an example of a defect detection process 900 performed that may be performed by a tool capable of measuring sample surface topography characteristics, such as such as interferometers 100 and 100' shown in FIGS. 1 and 2, and interferometer 400 shown in FIG. 4. As illustrated in FIG. 9, image data 902 is acquired from the inspection device. As discussed above, the image data 902 may be acquired from a single image of the region of interest captured by an interferometer. FIG. 10A, by way of example, illustrates image data acquired from a sample wafer 1000 that includes a number of dies 1002. Using interferometers 100 or 100', an image 1010 may be acquired from the sample 1000, as illustrated by dashed lines 1012. Image 1010 may be of a region 1004 of the sample 1000 that includes only a single die 1002, multiple die or only a portion of a die 1002. The image 1010 consists of superpixels 1014, each of which contain a 2×2 unit 1020 of the pixels with 90 degree phase shifts, e.g., produced by the phase shift mask 156 and detected by the detector array 158. The data from the image 1010 is then used to construct derived images which describe topography characteristics.

Figure 10B:
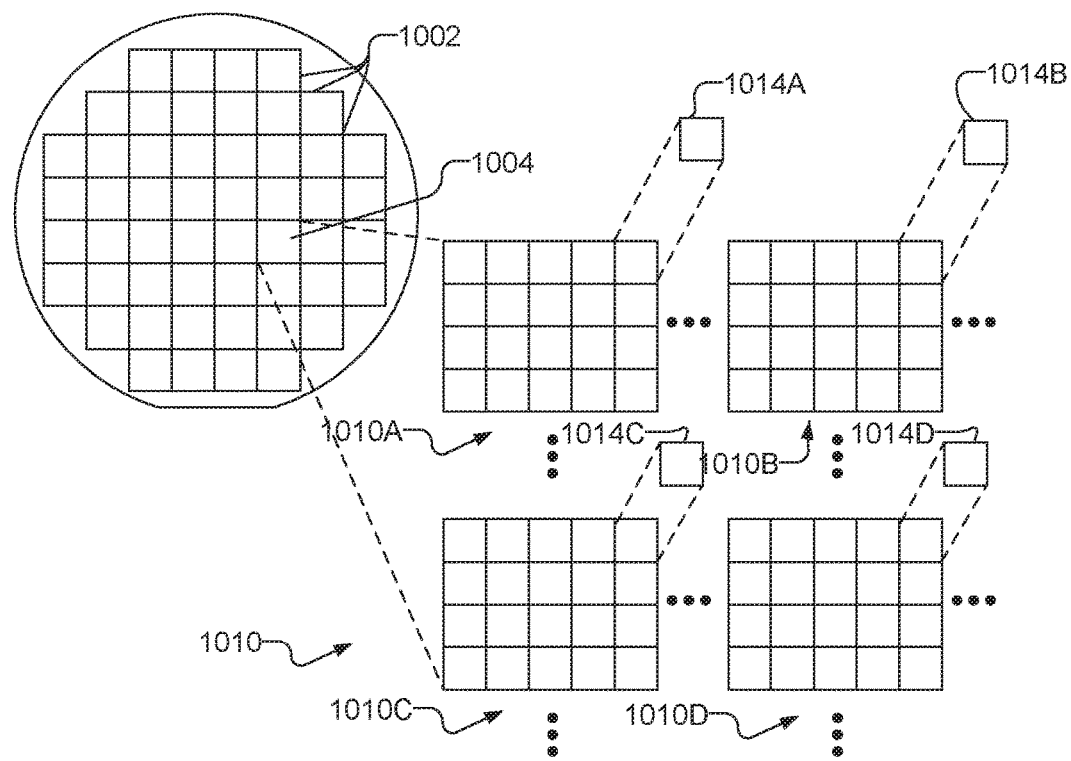
FIG. 10B illustrates image data acquired by a phase shift interferometer, such as that shown in FIG. 4.

FIG. 10B illustrates an example of image data acquired from the sample wafer 1000 using interferometer 400. As illustrated, the image data acquired by interferometer 400 will have four images 1010A, 1010B, 1010C, and 1010D of the same region 1004 of the sample 1000. Each image includes a plurality of pixels, where corresponding pixels 1014A, 1014B, 1014C, and 1014D are for the same location on the sample 1000. Each of the corresponding pixels 1014A, 1014B, 1014C, and 1014D, has a different phase shifts, e.g., produced by the polarizers 456A, 456B, 456C, and 456D in the interferometer 400 (shown in FIG. 4).

Referring back to FIG. 9, the image data 902 for a location on the sample, e.g., for a pixel 1014, shown in FIGS. 10A and 10B with multiple phase shifts, is analyzed at process 910 to generate image data that can be compared to images of a reference surface. For example, phase unwrapping 912 is used with the image data 902 to remove any 2π ambiguity in the phase angle calculated by the arctangent function of equation 1. For example, multiple solutions exist for z in equation 1 because the arctangent function repeats if multiples of 2π are added to the angle. Hence it is not possible to differentiate between a result of z and z+n$\lambda$/2, where n is any integer. The period of the fringe pattern with change in z is $\lambda$/2. If a broad bandwidth source is used, fringes appear over a limited range of z. If the amplitudes of the fringes vary rapidly enough, then the peak fringe can be determined and ambiguity due to phase may be reduced or eliminated. The importance of phase wrapping is reduced in semiconductor applications because the surface topography is typically limited to 100 nm or less by the shallow depth of focus of the tools used to print patterns. Consequently, for light in the visible wavelength range, all surfaces may fall within a single fringe period, provided that the surface is not excessively tilted with respect to the measurement axis, and provided the instrument does not introduce larger artificial topography.

In addition, background correction 914 may be performed. The topography characteristics of the sample, e.g., surface height measured at each position of the sample, are measured relative to an unknown reference plane. The defect detection will use a comparison of topography characteristics of the sample to topography characteristics of one or more reference surfaces, which may also have unknown reference planes. When performing a comparison of topography characteristics from a location in sample and a corresponding location (that is identical by design), the reference planes may not be the same. Background correction 914 removes the reference plane in the sample image (and is also used for the reference image) so that a comparison can be made. In one implementation, background correct 914 may be performed for every pixel in the image captured by the detector array 158 by least-square fitting a tilted plane to a set of neighboring pixels. The value of the fitted plane at the target pixel is taken as the background. The background may then be calculated and subtracted from every pixel.

Additionally, spatial registration 916 of the image data 902 is performed. Spatial registration 916 provides the lateral (x,y) registration of the image data 902, so that the topography characteristics determined from image data for a specific physical location on the test sample may be compared to topography characteristics determine from a reference image of the same location on a reference sample.

After process 910, the image data 902 is ready for comparison with one or more reference surfaces and the image data may be stored in storage 918, e.g., which may be memory 174 (shown in FIG. 1) or other storage mechanism, which may be part of or separate from the computer 170 shown in FIG. 1.

The process of defect detection process 900 may use one or more one detection channels utilizing different referencing methodologies, e.g., local reference 920, non-local reference 930, and golden reference 940, which may be utilized in parallel. Further, as illustrated, each detection channel may be divided into a number of stages. For example, as illustrated for the local reference process 920, there may be detection signal extraction 922, threshold 924, and feature extraction 926. The non-local reference 930 and golden reference 940 may include similar stages, as illustrated.

The detection signal extraction process 922 performs a pixel-to-pixel comparison of the image data for the test image and image data for a reference image, e.g., for the local reference 920, non-local reference 930, or golden reference 940 to extract a signal that may indicate the presence of a defect. For example, a topography characteristic of the test sample may be compared to the same topography characteristic of the reference sample(s). One example of topography characteristics is the surface height z for each pixel, and a comparison results in a surface height difference for each pixel. Another example of topography characteristics is a roughness value for each pixel, and a comparison results in a roughness difference. For example, a roughness value for each pixel may be determined by determining the surface heights z for a neighborhood of pixels around each target pixel, e.g., the 8 or 24 (or other number of) pixels surrounding a target pixel, and a standard deviation value is determined for the target pixel, which may be used as the roughness value for the target pixel. Roughness may be determined in other manners if desired. The result is an image where the value at each pixel indicates the local roughness over the neighborhood pixels. Other topography characteristics besides surface height and roughness may be used if desired. The choice of the topography characteristics, for example, may depend on the specific type of defect to be detected. A difference signal may be determined as the pixel-to-pixel difference in topography characteristic between the target image and reference image. If desired, difference signals may be determined by one or more of the detection signal extraction process 922, 932, and 942 for the local reference 920, non-local reference 930, and golden reference 940, respectively.

A threshold process 924 is used to indicate, e.g., "flag," any pixel that is part of a defect and to group those pixels into "blobs," forming a set of candidate defects. For example, in one implementation, the difference signal for the topography characteristic at each pixel is compared to a threshold, and any pixel with a difference signal exceeding the threshold is flagged as a candidate defect pixel. In another implementation, hysteresis threshold may be used, where initial pixels are flagged as candidate defect pixels using a first threshold, and any secondary pixels connected to an initial pixel, and if desired, connected to secondary pixels, use a second threshold that is less stringent than the first threshold, e.g., the second threshold permits a smaller surface height difference or roughness standard deviation to qualify as a candidate defect pixel. After thresholding, candidate defect pixels that are connected to one another are grouped into "blobs," e.g., using a 8-connected neighborhood. Each resulting group (i.e., "blob") of candidate defect pixels represents a candidate defect determined by one or more of the threshold process 924, 934, and 944 for the local reference 920, non-local reference 930, and golden reference 940, respectively.

A feature extraction process 926 is used to provide one or more descriptors for each candidate defect, i.e., blob of candidate defect pixels. Descriptors are useful as the thresholding process is likely to identify candidate defects that are not actually defects, and descriptors may be used to remove these and leave only a filtered result, which may be identified as defects. Descriptors, for example, may be for one more aspects of candidate defects, such as size, both lateral (e.g., x and y) and height (e.g., z, including maximum or average), roughness, shape, and more complex descriptors of texture, such as Haralick features. Many machine learning and computer vision packages include options for feature extraction. The features that may be used may depend on the defects of interest and the set of nuisance defects that need to be filtered. Thus, one or more descriptors are provided for each candidate defect by the feature extraction process 926, 936, and 946 for the local reference 920, non-local reference 930, and golden reference 940, respectively.

The resulting candidate defects with their one or more descriptors for one or more of the local reference 920, non-local reference 930, and golden reference 940 may be provided to a filtering process 950. The filtering process 950 may apply various rules to the candidate defects and their descriptors to identify actual defects, which are produced as the result. For example, the filtering process 950 may filter candidate defects based on size (e.g., lateral size and/or height, such as maximum height or average height), roughness, shape, Haralick features, etc. to determine if a candidate defect qualifies as a defect. The rules may be simple thresholds or complex combinations of thresholds that may vary based on other characteristics. For example, a rule for a height threshold may be reduced if the lateral size of a candidate defect is sufficiently large, or if the candidate defect is present in more than one detection channel, e.g., the local reference 920, non-local reference 930, and golden reference 940. The filtering process 950, for example, may be performed using supervised learning, with a user defining the defects of interest, and machine learning model training the classification and filtering of nuisance blobs.

Figure 11:
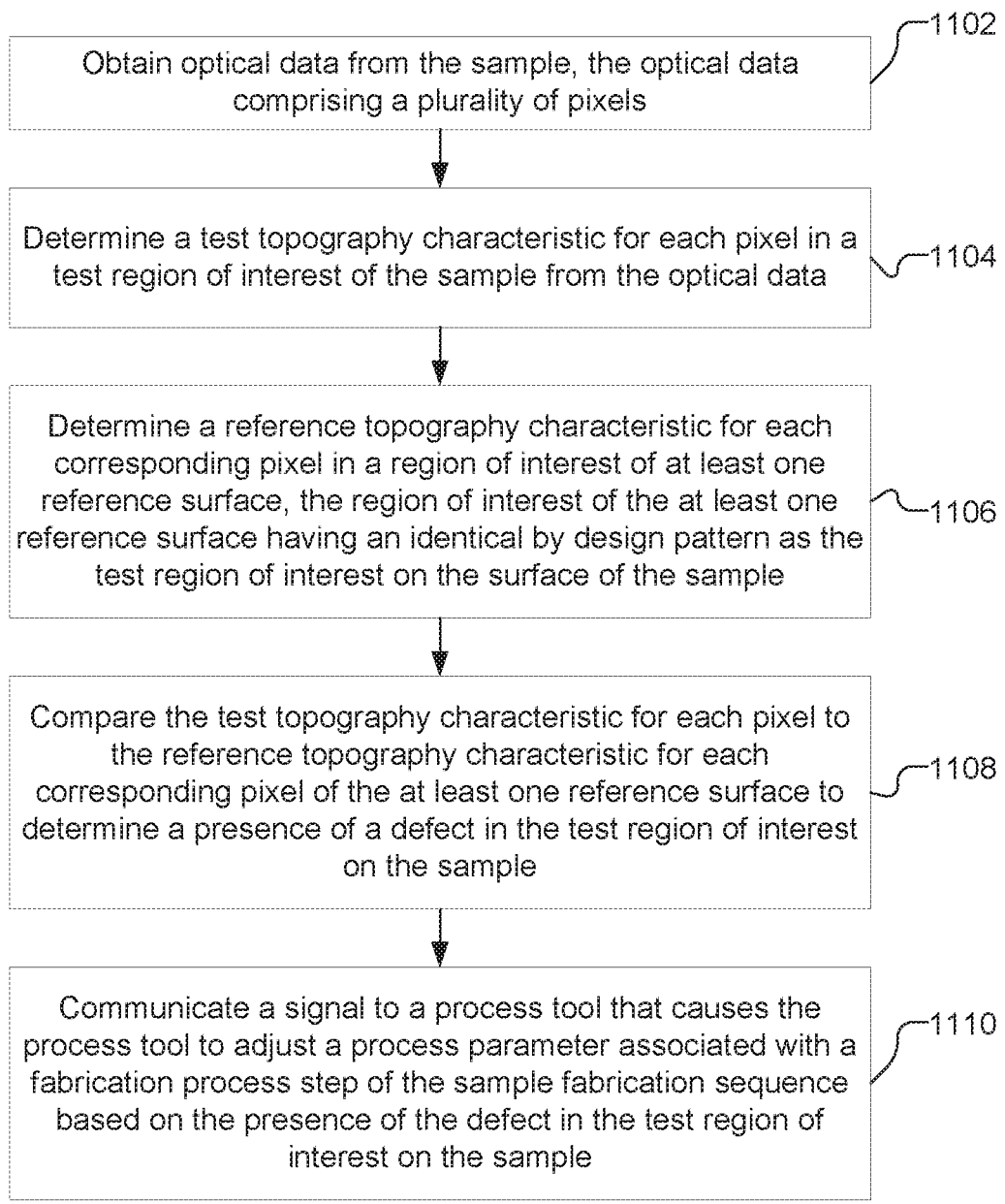
FIG. 11 is a flow chart illustrating a process of detecting a defect on a sample using topography characteristics of a sample and one or more reference surfaces.

FIG. 11 is a flow chart illustrating a process of detecting a defect on a sample. By way of example, the defect may be residue, dishing, edge roll-off, hotspot, pit, scratch, and bridge, or any combination thereof. As illustrated, optical data from the sample is obtained, the optical data comprising a plurality of pixels (1102). The optical data may be interferometer data, such as that collected by interferometer 100, 100', 400, or 500 as illustrated in FIG. 1, 2, 4, or 5, respectively. By way of example, obtaining the interferometer data may include capturing an image of the test region of interest, wherein the image comprises a plurality of phase shift measurements for the test region of interest, e.g., as performed by interferometer 100 or 100' illustrated in FIG. 1 or 2, respectively. In another example, obtaining the interferometer data may include simultaneously capturing a plurality of images of the test region of interest, wherein each of the plurality of images comprises a different phase shift measurement for the test region of interest, e.g., as performed by interferometer 400 illustrated in FIG. 4.

A test topography characteristic for each pixel in a test region of interest of the sample may be determined from the optical data (1104). A reference topography characteristic may be determined for each corresponding pixel in a region of interest of at least one reference surface, the region of interest of the at least one reference surface having an identical by design pattern as the test region of interest on the surface of the sample (1106). For example, the test topography characteristic may be determined as surface height values for a plurality of pixels. In another example, the test topography characteristic may be determined as texture values for a plurality of pixels. The texture values for the plurality of pixels, for example, may be roughness values for each location such as a statistical property of surface height values for surrounding pixels. For example, the statistical property of the surface height values for the surrounding pixels may be a standard deviation.

The test topography characteristic for each pixel is compared to the reference topography characteristic for each corresponding pixel of the at least one reference surface to determine a presence of a defect in the test region of interest on the sample (1108). For example, comparing the test topography characteristics to the reference topography characteristic may include generating a topography characteristics difference for each pixel in the test region of interest of the sample; identifying pixels with the topography characteristics difference exceeding a predetermined threshold; and identifying the presence of the defect using the pixels with the topography characteristics difference exceeding the predetermined threshold. For example, identifying the presence of the defect may include grouping the pixels with the topography characteristics difference exceeding the predetermined threshold into candidate defects; generating associated descriptors for the candidate defects, wherein the descriptors comprise at least one of lateral size, height, shape, and texture; and filtering the candidate defects using the associated descriptors to identify a candidate defect as a defect. For example, filtering the candidate defects may include filtering using one or more of lateral size, height, shape, texture, or a combination thereof.

Defect data, including the presence of the defect in the test region of interest on the sample, may be communicated to adjust one or more process tools associated with a fabrication process step in the fabrication sequence or to alter a future fabrication sequence of the sample (1110). For example, the defect data, which may include location and type of defect, may be used to adjust a process tool that is responsible for the detected defect by adjusting one or more process parameters, such as composition of the slurry of a CMP tool, or removing the process tool from the production line to prevent the process tool from producing defects in later processed samples. Additionally, the defect data may be used adjust the fabrication sequence of the sample itself, e.g., by rejecting or discarding the sample or a portion of the sample, e.g., the entire wafer or a die from the wafer. Thus, the detection of a defect may be used to modify, alter, or inform further processing of the test sample or processing of other samples.

In one implementation, comparing the test topography characteristics to the reference topography characteristic for the at least one reference surface uses a plurality of different types of reference surfaces. For example, the plurality of different types of reference surfaces may include two or more of a local reference surface, a non-local reference surface, and a golden reference surface. The local reference surface may be a surface from at least one local region of interest on the sample. The non-local reference surface may be a surface from at least one non-local region of interest on the sample. The golden reference surface may be a surface from at least one region of interest on one or more different samples. In one implementation, the sample is a semiconductor wafer comprising a plurality of dies, and the at least one local region of interest on the sample may be at least one region of interest on the semiconductor wafer that is no more than one die away from the test region of interest of the sample. The at least one non-local region of interest on the sample may be at least one region of interest on the semiconductor wafer that is more than one die away from the test region of interest of the sample.

In one implementation, for nonlocal and golden referencing, the at least one reference surface may be a reference surface generated as a statistical combination of a plurality of reference surfaces.

Figure 12:
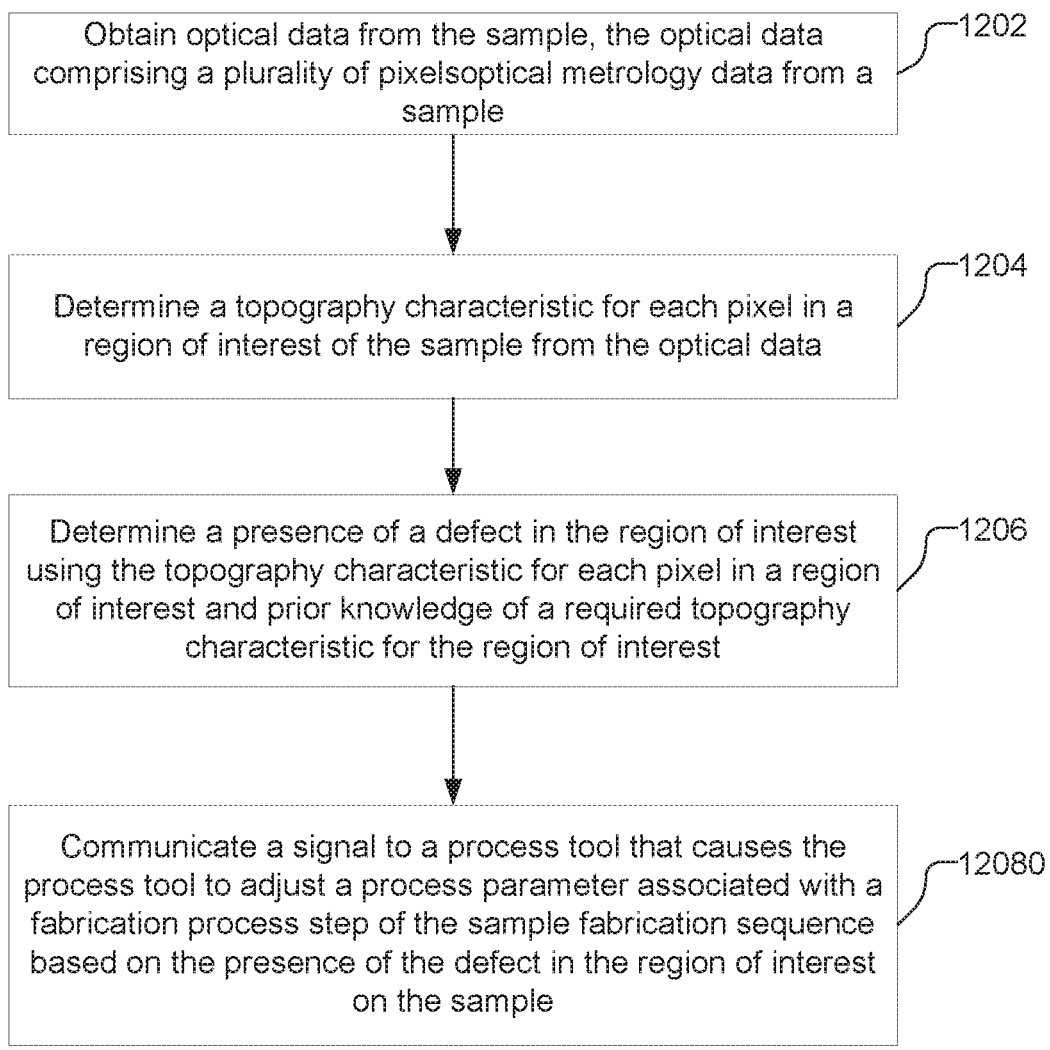
FIG. 12 is a flow chart illustrating another process of detecting a defect on a sample using topography characteristics of a sample and prior knowledge of the required topography characteristic of a region of interest.

FIG. 12 is a flow chart illustrating another process of detecting a defect on a sample. The process illustrated in FIG. 12 differs from that illustrated in FIG. 11 as there may be no reference measurements. The process of FIG. 12, for example, may be useful when all instances of an ROI on a wafer have some degree of defectivity and referencing provides little difference signal. As illustrated, optical data from the sample is obtained, the optical data comprising a plurality of pixels (1202). The optical data may be interferometer data, such as that collected by interferometer 100, 100', 400, or 500 as illustrated in FIG. 1, 2, 4, or 5, respectively. By way of example, obtaining the interferometer data may include capturing an image of the test region of interest, wherein the image comprises a plurality of phase shift measurements for the test region of interest, e.g., as performed by interferometer 100 or 100' illustrated in FIG. 1 or 2, respectively. In another example, obtaining the interferometer data may include simultaneously capturing a plurality of images of the test region of interest, wherein each of the plurality of images comprises a different phase shift measurement for the test region of interest, e.g., as performed by interferometer 400 illustrated in FIG. 4.

A topography characteristic for each pixel in a region of interest of the sample may be determined from the optical data (1204). The region of interest may be an overlay target, e.g., as illustrated in FIGS. 8A and 8B. The topography characteristic may be determined as surface height values for a plurality of pixels. In another example, the topography characteristic may be determined as texture values for a plurality of pixels. The texture values for the plurality of pixels, for example, may be roughness values for each location such as a statistical property of surface height values for surrounding pixels. For example, the statistical property of the surface height values for the surrounding pixels may be a standard deviation.

A presence of a defect in the region of interest is detected using the topography characteristic for each pixel in a region of interest and prior knowledge of a required topography characteristic for the region of interest (1206). For example, the defect may be an asymmetry in the topography characteristic of the overlay target, e.g., as shown in FIGS. 8A and 8B. As discussed, if all shots on the wafer have some degree of this asymmetry, then referencing may provide little signal for detection. Accordingly, instead of referencing, knowledge of the required topography characteristic is used, e.g., that the overlay target in FIGS. 8A and 8B should have coplanar shaded and non-shaded structures, as well as a planar underlying structure 804. With this knowledge, differences in the relative height of the shaded structures in FIGS. 8A and 8B may be flagged as defects, and likewise for nonshaded and underlying structures.

Defect data, including the presence of the defect in the test region of interest on the sample, may be communicated to adjust one or more process or metrology tools associated with a fabrication process step in the fabrication sequence or to alter a future fabrication sequence of the sample (1208). For example, the defect data, which may include location and type of defect, may be used to adjust the operation of a metrology tool, e.g., by avoiding the use of a target that includes a defect or considering the defect during analysis of the defect, e.g., by correcting a model of the target to include the defect. Additionally, the defect data may be used to adjust a process tool that is responsible for the detected defect by adjusting one or more process parameters, such as composition of the slurry of a CMP tool, or removing the process tool from the production line to prevent the process tool from producing defects in later processed samples. Additionally, the defect data may be used to adjust the fabrication sequence of the sample itself, e.g., by rejecting or discarding the sample or a portion of the sample, e.g., the entire wafer or a die from the wafer. Thus, the detection of a defect may be used to modify, alter, or inform further processing of the test sample or processing of other samples.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An optical inspection apparatus configured to detect a defect in a test region of interest on a sample, the optical inspection apparatus comprising:
   a light source that produces an illumination beam of light that is incident on the sample and reflected by the sample;
   at least one detector array that receives the light after it is reflected by the sample to obtain optical data from the sample, the optical data comprising a plurality of pixels;
   at least one processor coupled to the at least one detector array to receive the optical data, wherein the at least one processor is configured to:
      determine a test topography characteristic for each pixel in the test region of interest of the sample from the optical data; and
      compare the test topography characteristic for each pixel to a reference topography characteristic for each corresponding pixel in a region of interest of at least one reference surface, the region of interest of the at least one reference surface having a same by design pattern as the test region of interest on the sample to determine a presence of the defect in the test region of interest on the sample.

2. The optical inspection apparatus of claim 1, wherein the optical inspection apparatus is an interferometer and the optical data comprises interferometer data.

3. The optical inspection apparatus of claim 2, wherein the at least one detector array comprises a single detector array with a plurality of pixels, the optical inspection apparatus further comprising a phase shift mask comprising an array of phase shift pixels aligned with the plurality of pixels of the single detector array, wherein the interferometer data comprises an image of the test region of interest, wherein the image comprises a plurality of phase shift measurements for the test region of interest.

4. The optical inspection apparatus of claim 2, wherein the at least one detector array comprises a plurality of detector arrays each with a plurality of pixels, the optical inspection apparatus further comprising a corresponding plurality of polarizers with each with a different orientation before each detector array to produce a different phase shift measurement, wherein the interferometer data comprises a plurality of images of the test region of interest that are simultaneously captured, wherein each of the plurality of images comprises different phase shift measurements for the test region of interest.

5. The optical inspection apparatus of claim 1, wherein the at least one processor is configured to determine the test topography characteristic for each pixel by being configured to determine a surface height value for each pixel in the test region of interest.

6. The optical inspection apparatus of claim 1, wherein the at least one processor is configured to determine the test topography characteristic for each pixel using neighboring pixels surrounding each pixel.

7. The optical inspection apparatus of claim 6, wherein the at least one processor is configured to determine the test topography characteristic each pixel by being configured to determine a statistical property for each pixel based on surface height values for the neighboring pixels surrounding each pixel.

8. The optical inspection apparatus of claim 7, wherein the statistical property comprises a standard deviation.

9. The optical inspection apparatus of claim 1, wherein the at least one processor is configured to compare the test topography characteristics for each pixel to the reference topography characteristic for each corresponding pixel in the region of interest of the at least one reference surface to determine the presence of the defect by being configured to:
    generate a topography characteristics difference for each pixel in the test region of interest of the sample;
    identify pixels with the topography characteristics difference exceeding a predetermined threshold; and
    identify the presence of the defect using the pixels with the topography characteristics difference exceeding the predetermined threshold.

10. The optical inspection apparatus of claim 1, wherein the at least one processor is configured to compare the test topography characteristics for each pixel to the reference topography characteristic for each corresponding pixel in the region of interest of the at least one reference surface to determine the presence of the defect by being configured to:
    group pixels together based on the comparison of the test topography characteristics for each pixel to the reference topography characteristic for each corresponding pixel into one or more candidate defects;
    generate one or more descriptors for the one or more candidate defects, wherein the one or more descriptors comprise at least one of lateral size, height, shape, roughness, and texture; and
    filter the one or more candidate defects using the one or more descriptors to identify a candidate defect as the defect.

11. The optical inspection apparatus of claim 10, wherein the at least one processor is configured to filter the one or more candidate defects using the one or more descriptors to identify the candidate defect as the defect by being configured to filter using one or more of lateral size, height, shape, roughness, texture, or a combination thereof.

12. The optical inspection apparatus of claim 1, wherein the at least one reference surface comprises a plurality of different types of reference surfaces.

13. The optical inspection apparatus of claim 12, wherein the plurality of different types of reference surfaces comprises two or more of a local reference surface, a non-local reference surface, and a golden reference surface, wherein the local reference surface comprises a surface from at least one local region of interest on the sample, the non-local reference surface comprises a surface from at least one non-local region of interest on the sample, and the golden reference surface comprises a surface from at least one region of interest on one or more different samples.

14. The optical inspection apparatus of claim 13, wherein the sample is a semiconductor wafer comprising a plurality of dies, and wherein the at least one local region of interest on the sample comprises at least one region of interest on the semiconductor wafer that is no more than one die away from the test region of interest of the sample, the at least one non-local region of interest on the sample comprises at least one region of interest on the semiconductor wafer that is more than one die away from the test region of interest of the sample.

15. The optical inspection apparatus of claim 1, wherein the at least one reference surface comprises a reference surface generated as a statistical combination of a plurality of reference surfaces.

16. The optical inspection apparatus of claim 1, wherein the defect in the test region of interest on the sample is one of residue, dishing, edge roll-off, hotspot, pit, scratch, and bridge.

17. The optical inspection apparatus of claim 1, wherein the at least one processor is configured to transmit defect data including the presence of the defect in the test region of interest on the sample.

18. An optical inspection apparatus configured to detect a defect, the optical inspection apparatus comprising:
    a light source that produces an illumination beam of light that is incident on a sample and reflected by the sample;
    at least one detector array that receives the light after it is reflected by the sample to obtain optical data from the sample, the optical data comprising a plurality of pixels;
    at least one processor coupled to the at least one detector array to receive the optical data, wherein the at least one processor is configured to:
        determine a topography characteristic for each pixel in a region of interest of the sample from the optical data; and
        determine a presence of the defect in the region of interest using the topography characteristic for each pixel in the region of interest and prior knowledge of a required topography characteristic for the region of interest.

19. The optical inspection apparatus of claim 18, wherein the optical inspection apparatus is an interferometer and the optical data comprises interferometer data.

20. The optical inspection apparatus of claim 19, wherein the at least one detector array comprises a single detector array with a plurality of pixels, the optical inspection apparatus further comprising a phase shift mask comprising an array of phase shift pixels aligned with the plurality of pixels of the single detector array, wherein the interferometer data comprises an image of the region of interest, wherein the image comprises a plurality of phase shift measurements for test region of interest.

21. The optical inspection apparatus of claim 19, wherein the at least one detector array comprises a plurality of detector arrays each with a plurality of pixels, the optical inspection apparatus further comprising a corresponding plurality of polarizers with each with a different orientation before each detector array to produce a different phase shift measurement, wherein the interferometer data comprises a plurality of images of the region of interest that are simultaneously captured, wherein each of the plurality of images comprises different phase shift measurements for the region of interest.

22. The optical inspection apparatus of claim 18, wherein the region of interest is an overlay target.

23. The optical inspection apparatus of claim 22, wherein the defect is an asymmetry in the topography characteristic of the overlay target.

24. The optical inspection apparatus of claim 18, wherein the at least one processor is configured to transmit defect data including the presence of the defect in the region of interest on the sample.

25. An optical inspection apparatus configured to detect a defect in a test region of interest on a sample, the optical inspection apparatus comprising:
    a light source that produces an illumination beam of light that is incident on the sample and reflected by the sample;
    at least one detector array that receives the light after it is reflected by the sample to obtain optical data from the sample, the optical data comprising a plurality of pixels;

means for determining a test topography characteristic for each pixel in the test region of interest of the sample from the optical data; and means for comparing the test topography characteristic for each pixel to a reference topography characteristic for each corresponding pixel in a region of interest of at least one reference surface, the region of interest of the at least one reference surface having a same by design pattern as the test region of interest on the sample to determine a presence of the defect in the test region of interest on the sample.

26. The optical inspection apparatus of claim 25, wherein the optical inspection apparatus is an interferometer and the optical data comprises interferometer data.

27. The optical inspection apparatus of claim 26, wherein the at least one detector array comprises a single detector array with a plurality of pixels, the optical inspection apparatus further comprising a phase shift mask comprising an array of phase shift pixels aligned with the plurality of pixels of the single detector array, wherein the interferometer data comprises an image of the test region of interest, wherein the image comprises a plurality of phase shift measurements for the test region of interest.

28. The optical inspection apparatus of claim 26, wherein the at least one detector array comprises a plurality of detector arrays each with a plurality of pixels, the optical inspection apparatus further comprising a corresponding plurality of polarizers with each with a different orientation before each detector array to produce a different phase shift measurement, wherein the interferometer data comprises a plurality of images of the test region of interest that are simultaneously captured, wherein each of the plurality of images comprises different phase shift measurements for the test region of interest.

29. The optical inspection apparatus of claim 25, wherein the test topography characteristic for each pixel in the test region of interest comprises a surface height value for each pixel in the test region of interest.

30. The optical inspection apparatus of claim 25, wherein the test topography characteristic for each pixel in the test region of interest is determined using neighboring pixels surrounding each pixel.

31. The optical inspection apparatus of claim 30, wherein the test topography characteristic each pixel comprises a statistical property of surface height values for the neighboring pixels surrounding each pixel.

32. The optical inspection apparatus of claim 31, wherein the statistical property comprises a standard deviation.

33. The optical inspection apparatus of claim 25, wherein the means for comparing comprises:

means for generating a topography characteristics difference for each pixel in the test region of interest of the sample;

means for identifying pixels with the topography characteristics difference exceeding a predetermined threshold; and means for identifying the presence of the defect using the pixels with the topography characteristics difference exceeding the predetermined threshold.

34. The optical inspection apparatus of claim 25, wherein the means for comparing comprises:

means for grouping pixels together based on the comparison of the test topography characteristics for each pixel to the reference topography characteristic for each corresponding pixel into one or more candidate defects;

means for generating one or more descriptors for the one or more candidate defects, wherein the one or more descriptors comprise at least one of lateral size, height, shape, roughness, and texture; and means for filtering the one or more candidate defects using the one or more descriptors to identify a candidate defect as the defect.

35. The optical inspection apparatus of claim 34, wherein the means for filtering the one or more candidate defects using the one or more descriptors to identify the candidate defect as the defect filters uses one or more of lateral size, height, shape, roughness, texture, or a combination thereof.

36. The optical inspection apparatus of claim 25, wherein the at least one reference surface comprises a plurality of different types of reference surfaces.

37. The optical inspection apparatus of claim 36, wherein the plurality of different types of reference surfaces comprises two or more of a local reference surface, a non-local reference surface, and a golden reference surface, wherein the local reference surface comprises a surface from at least one local region of interest on the sample, the non-local reference surface comprises a surface from at least one non-local region of interest on the sample, and the golden reference surface comprises a surface from at least one region of interest on one or more different samples.

38. The optical inspection apparatus of claim 37, wherein the sample is a semiconductor wafer comprising a plurality of dies, and wherein the at least one local region of interest on the sample comprises at least one region of interest on the semiconductor wafer that is no more than one die away from the test region of interest of the sample, the at least one non-local region of interest on the sample comprises at least one region of interest on the semiconductor wafer that is more than one die away from the test region of interest of the sample.

39. The optical inspection apparatus of claim 25, wherein the at least one reference surface comprises a reference surface generated as a statistical combination of a plurality of reference surfaces.

40. The optical inspection apparatus of claim 25, wherein the defect in the test region of interest on the sample is one of residue, dishing, edge roll-off, hotspot, pit, scratch, and bridge.

41. The optical inspection apparatus of claim 25, further comprising means for transmitting defect data including the presence of the defect in the test region of interest on the sample.

* * * * *